US007045272B2

(12) United States Patent
Kawamura et al.

(10) Patent No.: US 7,045,272 B2

(45) Date of Patent: May 16, 2006

(54) PLANOGRAPHIC PRINTING PLATE PRECURSOR

(75) Inventors: Koichi Kawamura, Shizuoka-ken (JP); Sumiaki Yamasaki, Shizuoka-ken (JP); Miki Takahashi, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 308 days.

(21) Appl. No.: 10/212,769

(22) Filed: Aug. 7, 2002

(65) Prior Publication Data

US 2003/0073033 A1 Apr. 17, 2003

(30) Foreign Application Priority Data

Aug. 15, 2001 (JP) ............................. 2001-246629

(51) Int. Cl.

*G03F 7/27* (2006.01)
*G03F 7/11* (2006.01)
*B41N 1/14* (2006.01)

(52) U.S. Cl. ................................. 430/276.1; 430/271.1

(58) Field of Classification Search ............. 430/271.1, 430/276.1, 278.1, 302, 167; G03F 7/11

See application file for complete search history.

(56) References Cited

U.S. PATENT DOCUMENTS

| | | | | |
|---|---|---|---|---|
| 3,690,880 A * | 9/1972 | Muzyczko et al. | ...... | 430/271.1 |
| 5,914,211 A * | 6/1999 | Hashino et al. | .......... | 430/271.1 |
| 6,672,210 B1 * | 1/2004 | Kawamura et al. | ......... | 101/457 |
| 2002/0023565 A1 * | 2/2002 | Kawamura et al. | ......... | 101/453 |

FOREIGN PATENT DOCUMENTS

| | | | |
|---|---|---|---|
| EP | 1 088 679 A2 | | 4/2001 |
| EP | 1 172 696 A1 | | 1/2002 |
| JP | 9-34110 A | * | 2/1997 |

OTHER PUBLICATIONS

The American Heritage Dictionary, Second College Edition, Haughton Mifflin Company, Boston, MA, 1982, “surface” p. 122.*

Konica Corp, Publication No. 09-034110 with attached machine translation from Patent Abstracts of Japan, publication dat of Feb. 2, 1997, from online “Searching PAJ”, copyright of Abstract 1998, Japan Patent Office, 30 pages.*

“Graft Copolymers” by P. Dreyfuss and R.P. Quirk on pp. 551 to 579 of vol. 7 of Encyclopedia of Polymer Science and Engineering, second edition, published in 1987 by John Wiley & Sons, New York, NY.*

“Molecular Weight”, from http://www.pslc.ws/mactest/weight.htm, 6 pages printed out on Jul. 29, 2005.*

* cited by examiner

*Primary Examiner*—Cynthia Hamilton
(74) *Attorney, Agent, or Firm*—Sughrue Mion, PLLC

(57) ABSTRACT

A negative planographic printing plate precursor includes a negative recording layer on a support. The support has a hydrophilic surface with hydrophilic graft polymer chains present therein. The negative recording layer contains a radical generator, a radical-polymerizing compound, and a photo-thermal converting agent. Preferably, the hydrophilic graft polymer chains are directly bonded to the support surface or to an intermediate layer formed on the support surface, or are introduced into a crosslinked polymer film structure.

18 Claims, No Drawings

PLANOGRAPHIC PRINTING PLATE PRECURSOR

BACKGROUND OF THE INVENTION

1. Field of the Invention

The present invention relates to a negative planographic printing plate precursor, in particular to a negative planographic printing plate precursor capable of being directly processed from the digital signals of computers, etc.

2. Description of the Related Art

Printing plates having ink-receiving oleophilic regions and ink-repellent regions (hydrophilic region) that are dampened with water. Various types of photosensitive planographic printing plate precursors (PS precursors) are currently used.

One type of PS precursor now widely used has a photosensitive layer formed on a support such as an aluminium sheet. A PS precursor of this type is exposed imagewise and developed to remove the photosensitive layer in the non-image area, and printing is carried out according to the hydrophilicity of the support surface and the hydrophobicity of the photosensitive layer in the image area. In the non-image area thereof, the PS plate is required not to have any photosensitive layer remaining thereon, but in the image area thereof, the recording layer must be well adhered to the support so it does not easily peel from it. In the non-image area of the PS plate, the hydrophilic support surface is exposed after the recording layer has been removed by development. However, if the exposed support surface is not satisfactorily hydrophilic, ink will adhere to it to cause stains in the prints. Therefore, the support surface of the PS precursor must be highly hydrophilic for preventing the non-image area thereof from being stained.

For the hydrophilic support or the hydrophilic layer of planographic printing plates, aluminium sheets subjected to anodic oxidation to form an oxide film thereon, or oxide film-coated aluminium sheets silicated to further increase their hydrophilicity have generally been used heretofore. Many studies relating to such hydrophilic supports or hydrophilic layers of aluminium are made these days. For example, JP-A No. 7-1853 discloses a support processed with an undercoating agent of polyvinylphosphonic acid; and JP-A 59-101651 discloses a technique of using a polymer containing a sulfonic acid group for the undercoat layer of the photosensitive layer. In addition, a technique of using polyvinylbenzoic acid for the undercoating agent for supports has also been proposed.

On the other hand, flexible PET (polyethylene terephthalate) or cellulose triacetate supports may be used in the place of aluminum metal supports, and various techniques relating to the hydrophilic layer for these have been proposed. For example, JP-A No. 8-292558 discloses a swellable hydrophilic layer comprising a hydrophilic polymer and a hydrophobic polymer; EP 0709228 discloses a PET support having a microporous, hydrophilic crosslinked silicate surface; and JP-A Nos. 8-272087 and 8-507727 disclose a hydrophilic layer containing a hydrophilic polymer and cured with a hydrolyzed tetraalkyl orthosilicate.

These hydrophilic layers are more hydrophilic than conventional ones, and provide plates that produce good prints at the start of printing with no stains. However, the layers are problematic in that they often peel off, and their hydrophilicity lowers by repeated use. Planographic printing plates in which the hydrophilic layer does not peel off from the support, and in which the hydrophilicity of the support surface does not lower even in severer printing conditions and which can produce a large number of good prints with no stains are therefore presently desired. For the reason of a further increase the hydrophilicity of the support surface of planographic printing plates is needed.

Accordingly, the object of the present invention is to provide a negative planographic printing plate precursor that makes possible a negative planographic printing plate capable of forming high-quality images free from the problem of printing stains.

SUMMARY OF THE INVENTION

We, the present inventors, have assiduously studied to attain the object as above, and, as a result, have found that the problems can be solved by forming a negative recording layer on a support having a hydrophilic surface of good and durable hydrophilicity, and so have carried out the present invention.

Specifically, the invention provides a negative planographic printing plate precursor having a negative recording layer on a support, characterized in that:

the support has a hydrophilic surface with hydrophilic graft polymer chains existing therein, and the negative recording layer contains a radical generator, a radical-polymerizing compound, and a photo-thermal converting agent.

In one embodiment of the negative planographic printing plate precursor, the hydrophilic graft polymer chains are directly bonded to the support surface or to an intermediate layer formed on the support surface.

In another embodiment of the negative planographic printing plate precursor, the hydrophilic graft polymer chains are introduced into a crosslinked polymer film structure.

In a preferred embodiment, the invention provides a negative planographic printing plate precursor comprising a hydrophilic surface layer and a negative recording layer in this order on a support, wherein:

the hydrophilic surface layer comprises hydrophilic graft polymer chains, the hydrophilic graft polymer chains were formed through copolymerization of a branch polymer with a stem polymer, the molecular weight of the stem polymer and the branch polymer was from 400 to 100,000, and the negative recording layer comprises a radical generator, a radical-polymerizable compound, and a photo-thermal converting agent;

wherein the hydrophilic graft polymer chains were introduced into a crosslinked polymer film structure.

Though perhaps a little lacking in precision, the mechanism of the planographic printing plate precursor of the invention can be described as follows: When exposed to light, the negative recording layer in the exposed region is polymerized and cured to form an image area, and the negative recording layer in the non-exposed region is readily removed by development with an alkali developer. The non-exposed region is made highly hydrophilic by a hydrophilic support that is exposed out, comprising hydrophilic graft polymer chains of high mobility therein. Accordingly, the non-exposed region (non-image region) of the thus-processed printing plate will rapidly absorb and release the dampened water at the time of printing, and the non-image region of the printing plate will be effectively prevented from staining owing to its high hydrophilicity.

DETAILED DESCRIPTION OF THE INVENTION

The negative planographic printing plate precursor of the invention is described in detail hereinunder.

The negative planographic printing plate precursor of the invention is characterized in that it has a negative recording layer formed on a support having a hydrophilic surface with hydrophilic graft polymer chains existing therein, and by the negative recording layer containing a radical generator, a radical-polymerizing compound, and a photo-thermal converting agent.

The support and the negative recording layer that constitute the negative planographic printing plate precursor of the invention are hereinafter described in detail. The Hydrophilic Surface Support and the Hydrophilic Surface:

The support of the present invention has a hydrophilic surface because it has hydrophilic graft polymer chains existing therein. The hydrophilic graft polymer chains may be directly bonded to the support surface, or an intermediate layer readily capable of receiving a graft polymer may be formed on the support surface and to this intermediate layer a hydrophilic polymer may be grafted. Apart from the above, a polymer having hydrophilic graft polymer chains directly bonded to the stem polymer chain, or a polymer having hydrophilic polymer chains directly bonded to the stem polymer chain and having a crosslinkable functional group introduced thereinto, may be applied onto a support on which the polymer is optionally crosslinked to thereby make a support surface including the hydrophilic graft polymer chains therein. Further, a composition comprising a hydrophilic polymer terminated with a crosslinkable group and a crosslinking agent may be applied onto a support on which the polymer is optionally crosslinked to thereby make a support surface including the hydrophilic graft polymer chains therein.

The hydrophilic polymer of the invention is characterized in that its terminal is bonded to the support surface or to the surface layer formed on the support, and the hydrophilic graft moiety of the polymer is not substantially crosslinked. With this specific structure, a polymer sustaining high mobility results, as the mobility of the hydrophilic moiety of the polymer is not limited and is not embedded inside its crosslinked structure. Therefore, it is believed that the hydrophilic polymer of the present invention exhibits excellent hydrophilicity compared with any other ordinary crosslinked hydrophilic polymer.

The molecular weight (Mw) of the hydrophilic graft polymer chains ranges from 500 to 5,000,000, preferably from 1,000 to 1,000,000, more preferably from 2,000 to 500,000.

In the invention, the embodiment wherein the support surface that has hydrophilic graft polymer chains directly bonded thereto or bonded to the intermediate layer formed thereon is referred to as a "surface graft"; and the other embodiment wherein the support surface has hydrophilic graft polymer chains introduced into the crosslinked polymer film structure formed thereon is referred to as "hydrophilic graft chains-introduced crosslinked hydrophilic layer". In the invention, the support and the support having an intermediate layer formed thereon are referred to as a "substrate".

Method of Constructing a Surface Graft:

There are two methods for making a substrate having a surface that has a hydrophilic group being consisted of a graft polymer. One method comprises adhering a graft polymer to the substrate by chemical bonding. The other comprises using the substrate as a base point for polymerizing a compound having a polymerizable double bond to form a graft polymer.

The method of adhering a graft polymer to the substrate by chemical bonding is hereinafter described. The polymer to be used in this method has at its terminals or side chains, a functional group capable of reacting with the substrate. This functional group is chemically reacted with the functional group in the surface of the substrate to graft the polymer to the substrate surface. There is no specific functional group to be used for the reaction, and it may be any group capable of reacting with the functional group in the substrate surface. Examples include a silane coupling group such as an alkoxysilane, as well as an isocyanate group, an amino group, a hydroxyl group, a carboxyl group, a sulfonic acid group, a phosphoric acid group, an epoxy group, an allyl group, a methacryloyl group, and an acryloyl group. Preferred examples of the polymer having a reactive functional group at its terminals or side chains are trialkoxysilyl-terminated hydrophilic polymers, amino-terminated hydrophilic polymers, carboxyl-terminated hydrophilic polymers, epoxy-terminated hydrophilic polymers, and isocyanate-terminated hydrophilic polymers.

The hydrophilic polymer is not specifically determined, and it may be any polymer as far as it is hydrophilic. Examples include polyacrylic acid, polymethacrylic acid, polystyrenesulfonic acid, poly-2-acrylamido-2-methylpropanesulfonic acid and its salts, polyacrylamide, and polyvinylacetamide. Also favorable for use herein are polymers of hydrophilic monomers stated hereinunder used in the surface graft polymerization, and also copolymers including such hydrophilic monomers.

The other method, which uses the substrate as a base point for polymerizing a compound having a polymerizable double bond to form the graft polymer, is generally referred to as surface graft polymerization. The surface graft polymerization method comprises exposing the substrate surface to plasma or light irradiation, or heating it to thereby make it have active seeds, followed by polymerizing a compound having a polymerizable double bond disposed in contact with the substrate to thereby bond the polymer to it.

The surface graft polymerization method of the invention may be any known one that has been documented. For example, optical graft polymerization and plasma graft polymerization are described on page 135 of "*New Polymer Experimentation* 10" (edited by the Polymer Society of Japan, 1994, published by Kyoritsu Publishing). On pages 203 and 695 of "*Adsorption Technique Handbook*" (supervised by Takeuchi, published by NTS in February 1999), radiation graft polymerization with γ rays or electron rays is described. Specific methods of optical graft polymerization are described in JP-A Nos. 63-92658, 10-296895 and 11-119413. Apart from the literature mentioned above, plasma graft polymerization and radiation graft polymerization are described also in "*Macromolecules*", Y. Ikeda et al. Vol. 19, p. 1804 (1986). All techniques disclosed in these references are applicable for the invention.

Specifically stated, the monomolecular surface of a polymer such as PET is processed with plasma or electron rays to generate radicals thereon, and then the activated surface is reacted with a hydrophilic functional group-containing monomer to thereby form a graft polymer surface layer, or, in other words, a hydrophilic group-containing surface layer.

Apart from the literature mentioned above, optical graft polymerization is also described in JP-A Nos. 53-17407 (by Kansai Paint) and 2000-212313 (by Dai-Nippon Ink and Chemicals). Specifically stated, a photopolymerizable composition is applied onto the surface of a film substrate, and then this is contacted with an aqueous radical-polymerizable compound and exposed to light. This method can also be implemented for the present invention.

Polymerizable Double Dond-Containing Compound Useful for Surface Graft Polymerization:

The compound used for forming hydrophilic graft polymer chains must have a polymerizable double bond and must be hydrophilic. It may be any hydrophilic polymer, hydrophilic oligomer, or hydrophilic monomer having a double bond in the molecule. Hydrophilic monomers are especially preferred for use in the invention. Preferred examples of hydrophilic monomers are monomers having a positive charge such as ammonium or phosphonium, and monomers having a negative charge or having an acid group capable of dissociating into a negative charge, such as a sulfonic acid group, a carboxyl group, a phosphoric acid group or a phosphonic acid group. Also preferred for use herein are hydrophilic monomers having a nonionic group such as a hydroxyl group, an amido group, a sulfonamido group, an alkoxy group or a cyano group.

Examples of hydrophilic monomers especially preferred for use in the invention are (meth)acrylic acid and its alkali metal salts and amine salts; itaconic acid and its alkali metal salts and amine salts; allylamine and its hydrohalides; 3-vinylproionic acid and its alkali metal salts and amine salts; vinylsulfonic acid and its alkali metal salts and amine salts; styrene sulfonic acid and its alkali metal salts and amine salts; 2-sulfoethylene (meth)acrylate, 3-sulfopropylene (meth)acrylate and their alkali metal salts and amine salts; 2-acrylamido-2-methylpropanesulfonic acid and its alkali metal salts and amine salts; acid phosphoxypolyoxyethylene glycol mono(meth)acrylate and its salts; 2-diethylaminoethyl (meth)acrylate and its hydrohalides; and 3-trimethylammoniumpropyl (meth)acrylate, 3-trimethylammoniumpropyl(meth)acrylamide, N,N,N-trimethyl-N-(2-hydroxy-3-methacryloyloxypropyl) ammonium chloride. Also usable herein are 2-hydroxyethyl (meth)acrylate, (meth)acrylamide, N-monomethylol(meth)acrylamide, N-dimethylol (meth)acrylamide, N-vinylpyrrolidone, N-vinylacetamide, polyoxyethylene glycol mono(meth)acrylate.

Method of Constructing Hydrophilic Graft Chains-Introduced Crosslinked Hydrophilic Layer:

In the invention, the hydrophilic graft chains-introduced crosslinked hydrophilic layer may be constructed by forming a graft polymer by a method generally known for graft polymer formation, followed by crosslinking the graft polymer. Graft polymer formation is described in Fumio Ide's "*Graft Polymerization and its Application*" (published by the Polymer Publishing, 1977) and in "*New Polymer Experimentation* 2, *Synthesis and Reaction of Polymer*" (edited by the Polymer Society of Japan, published by Kyoritsu Publishing, 1995).

Basically, graft polymer formation is grouped into three methods: (1) a method of polymerizing a graft monomer from a stem polymer to form grafts; (2) a method of bonding graft polymers to a stem polymer; and (3) a method of copolymerizing a graft polymer with a stem polymer (macromerization). Any of these three methods is employable for constructing the hydrophilic surface of the invention, but the macromerization method (3) is the best for its production and for the fact that the film structure formed is easy to control. Macromerization to form graft polymers is described in "*New Polymer Experimentation* 2, *Synthesis and Reaction of Polymer*" (edited by the Polymer Society of Japan, published by Kyoritsu Publishing, 1995), and also in "*Macromonomer Chemistry and Industry*" Yu Yamashita et al. (by IPC, 1989).

Specifically stated, a hydrophilic monomer such as acrylic acid, acrylamide, 2-acrylamido-2-methylpropanesulfonic acid or N-vinylacetamide stated hereinabove is used for the organic crosslinked hydrophilic layer to form the hydrophilic macromer according to the methods described in the literature.

Hydrophilic macromers especially useful in the invention are macromers derived from a carboxyl group-containing monomer, such as acrylic acid or methacrylic acid; sulfonic acid macromers derived from a monomer of 2-acrylamido-2-methylpropanesulfonic acid, styrenesulfonic acid and their salts; amide macromers of acrylamide or methacrylamide; amide macromers derived from an N-vinylcarbonamide monomer such as N-vinylacetamide or N-vinylformamide; macromers derived from a hydroxyl group-containing monomer such as hydroxyethyl methacrylate, hydroxyethyl acrylate or glycerol monomethacrylate; and macromers derived from an alkoxy or ethyleneoxide group-containing monomer such as methoxyethyl acrylate, methoxypolyethylene glycol acrylate or polyethylene glycol acrylate. In addition, monomers having a polyethylene glycol chain or a polypropylene glycol chain are also useful.

The molecular weight of the macromer may be from 400 to 100,000, but preferably from 1,000 to 50,000, more preferably from 1,500 to 20,000. If its molecular weight is smaller than 400, the macromer becomes ineffective; but if larger than 100,000, the macromer does not polymerize well with the comonomer that forms the main polymer chain.

One method of using the synthesized hydrophilic macromer to prepare the hydrophilic graft chains-introduced crosslinked hydrophilic layer of the invention comprises copolymerizing the hydrophilic macromer with a monomer having a reactive functional group to synthesize a graft copolymer, then applying the resulting graft copolymer onto a support along with a crosslinking agent capable of reacting with the reactive functional group of the copolymer, and thermally reacting the two to crosslink the copolymer on the support. Another method comprises synthesizing the hydrophilic macromer and a graft polymer having a photo-crosslinking group or a polymerizing group, applying them onto a support, and light irradiating the two to crosslink the graft polymer on the support.

Using the above methods, therefore, the substrate may be formed to have a hydrophilic surface with hydrophilic graft polymer chains existing therein. The thickness of the hydrophilic surface layer may be determined according to intentions. In general, however, it is preferably between 0.001 μm and 10 μm, more preferably between 0.01 μm and 5 μm, and most preferably between 0.1 μm and 2 μm. If it is too thin, the scratch resistance of the layer will be low. If it is too thick, the ink repellency of the layer will be low.

If the hydrophilicity of the substrate surface is high, it is not always required to be completely coated with a hydrophilic graft polymer. In the case where a hydrophilic graft polymer is introduced into the surface of a known hydrophilic substrate, introduction of an amount of at least 0.1% of the overall surface area of the substrate will be enough to sufficiently improve its hydrophilicity. More preferable is an introduction into the substrate surface of an amount of at least 1%, even more preferably at least 10%, of the overall surface area of the substrate.

Support:

There are no specific limits to the formation of the support. It may be any tabular support of good dimensional stability that satisfies the necessary requirements of flexibility, strength and durability. Examples of the support include paper, paper laminated with plastic (e.g., polyethylene terephthalate, polyethylene naphthalate, polyethylene, polypropylene, polystyrene), metal sheets (e.g., aluminium, zinc, copper), plastic films (e.g., cellulose diacetate, cellulose triacetate, cellulose propionate, cellulose butyrate, cellulose acetate butyrate, cellulose nitrate, polyethylene terephthalate, polyethylene naphthalate, polyethylene, polystyrene, polypropylene, polycarbonate, polyvinylacetal), or metal-laminated or deposited paper or plastic films using metals above. For the support of the invention, polyester films and aluminium sheets are preferred. Aluminium-laminated or deposited plastic films are also preferred. The aluminium sheets of the invention are preferably pure aluminium sheets or aluminium-based alloy sheets containing trace quantities of hetero elements. The hetero elements be in the aluminium alloy may include silicon, iron, manganese, copper, magnesium, chromium, zinc, bismuth, nickel, and titanium. The hetero element content of the alloy is preferably 10% by weight maximum. In the invention, pure aluminium is especially preferred for the support. However, it is difficult to produce 100% pure aluminium in view of the exsiting smelting technology, so aluminium containing trace quantities of hetero elements is acceptable.

The aluminum sheet is not required to have a specific composition, and any known aluminium sheet generally used in the art is usable herein. The thickness of the aluminium sheet for use herein is approximately from 0.1 mm to 0.6 mm, preferably from 0.15 mm to 0.4 mm, and more preferably from 0.2 mm to 0.3 mm.

Surface Properties of the Support:

The support is formed to have a hydrophilic surface with hydrophilic graft polymer chains existing therein. Preferably, the surface of the support is pre-roughened for improving the hydrophilicity, and for improving the adhesiveness of the hydrophilic surface to an image-forming layer to be formed thereon. One preferred embodiment of the surface properties of the support surface (solid surface) of the invention is described below.

The preferred condition of the surface-roughened support for use in the invention is indicated by two-dimensional roughness parameters which are as follows. Preferably, the support satisfies at least one, more preferably all of the requirements of two-dimensional roughness parameters: The center line mean roughness (Ra) falls between 0.1 and 1 μm; the maximum height (Ry) falls between 1 and 10 μm; the 10-point mean roughness (Rz) falls between 1 and 10 μm; the mountain-to-valley mean distance (Sm) falls between 5 and 80 μm; the mountain-to-mountain mean distance (S) falls between 5 and 80 μm; the maximum height (Rt) falls between 1 and 10 μm; the center line mountain height (Rp) falls between 1 and 10 μm; and the center line valley depth (Rv) falls between 1 and 10 μm.

The two-dimensional roughness parameters are defined as follows:

Center Line Mean Roughness (Ra):

A predetermined length, L, of the roughness curve is sampled in the direction of the center line of the curve, and the absolute values of the deviation of the center line from the roughness curve in the sampled section are arithmetically averaged. The arithmetic average indicates the center line mean roughness (Ra).

Maximum Height (Ry):

A predetermined length of the roughness curve is sampled in the direction of the mean line of the curve, and the distance between the mountain peak line and the valley bottom line is measured in the direction of the longitudinal magnification of the roughness curve. This indicates the maximum height (Ry)

10-Point Mean Roughness (Rz):

A predetermined length of the roughness curve is sampled in the direction of the mean line of the curve. The height of each mountain in the sampled section and the depth of each valley therein are measured from the mean line in the direction of the longitudinal magnification of the mean line. The average of the absolute values of the height (Yp) of the first to fifth highest mountains, and the average of the absolute values of the depth (Yv) of the first to fifth deepest valleys are added. The sum of the two indicates the 10-point mean roughness (Rz) in the unit of micrometers (μm).

Mountain-to-Valley Mean Distance (Sm):

A predetermined length of the roughness curve is sampled in the direction of the mean line of the curve. In the sampled section, the length of the mean line that crosses one mountain and that of the mean line that crosses the valley neighboring to that mountain are added. All the data of the mountain-to-valley distance thus measured are arithmetically averaged. The arithmetic average indicates the mountain-to-valley mean distance (Sm) in the unit of micrometers (μm).

Mountain-to-Mountain Mean Distance (S):

A predetermined length of the roughness curve is sampled in the direction of the mean line of the curve. In the sampled section, the length of the mean line between the neighboring mountain peaks is measured. All the data of the mountain-to-mountain distance thus measured are arithmetically averaged. The arithmetic average indicates the mountain-to-mountain mean distance (S) in the unit of micrometers (μm).

Maximum Height (Rt):

A predetermined length of the roughness curve is sampled. The sampled section is sandwiched between two straight lines both parallel to the center line of the roughness curve, and the distance between the two straight lines is measured. This indicates the maximum height (Rt).

Center Line Mountain Height (Rp):

A predetermined length, L, of the roughness curve is sampled in the direction of the center line of the curve. In the sampled section, a straight line tangent to the highest mountain peak and parallel to the center line is drawn, and the distance between the straight line and the center line is measured. This indicates the center line mountain height (Rp)

Center Line Valley Depth (Rv):

A predetermined length, L, of the roughness curve is sampled in the direction of the center line of the curve. In the sampled section, a straight line tangent to the deepest valley bottom and parallel to the center line is drawn, and the distance between the straight line and the center line is measured. This indicates the center line valley depth (Rv).

Negative Recording Layer:

The negative planographic printing plate precursor of the invention has a negative recording layer formed on the hydrophilic surface of the support. The negative recording layer will be simply referred to as a recording layer, and it is described in detail hereinunder. The negative recording layer is characterized in that it contains a radical generator, a radical-polymerizing compound, and a photo-thermal converting agent. When exposed to light, heat, or a combination of both, the radical generator in the exposed region of the negative recording layer is optically and/or thermally decomposed to generate a radical. The radical-polymerizing compound in the exposed region is polymerized by chain reaction caused by the radical generated by the radical generator, whereby the region is cured to form an image area.

The constitutive components of the negative recording layer are described below.

Radical Generator:

The radical generator (radical polymerization initiator) in the negative recording layer of the invention is a compound which optically and/or thermally generates a radical to initiate and promote the polymerization of a polymerizing unsaturated group-containing compound. For the radical generator of the invention, any known thermal polymerization initiators and compounds having a bond that requires low energy for bond dissociation may be selectively used. Examples include onium salts, trihalomethyl group-containing triazine compounds, peroxides, azo-type polymerization initiators, azide compounds, quinonediazide compounds, metallocene compounds, and organic boride compounds. Onium salts as described below are preferred as their sensitivity is high.

Preferred onium salts include diazonium salts, iodonium salts, sulfonium salts, ammonium salts and pyridinium salts. Of the above, iodonium salts, diazonium salts and sulfonium salts are more preferred. In the invention, such onium salts do not act as an acid generator but as an ionic radical polymerization initiator. Preferred onium salts are indicated by the following general formulae (III) to (V).

Formula (III)

$$Ar^{11}—\overset{+}{I}—Ar^{12}\quad Z^{11-}$$

Formula (IV)

$$Ar^{21}—\overset{+}{N}\equiv N\ Z^{21-}$$

-continued

Formula (V)

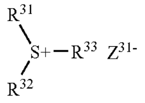

In formula (III), $Ar^{11}$ and $Ar^{12}$ each independently represent an optionally-substituted aryl group-containing 20 carbon atoms maximum. Preferred examples of the substituent for the substituted aryl group are a halogen atom, a nitro group, an alkyl group-containing at most 12 carbon atoms, an alkoxy group-containing 12 carbon atoms maximum, and an aryloxy group-containing 12 carbon atoms maximum. $Z^{11-}$ represents a counter ion selected from a halide ion, a perchlorate ion, a tetrafluoroborate ion, hexafluorophosphate ion, a carboxylate ion, and a sulfonate ion. A perchlorate ion, a hexafluorophosphate ion, a carboxylate ion, or an arylsulfonate ion is preferred.

In formula (IV), $Ar^{21}$ represents an optionally-substituted aryl group-containing 20 carbon atoms maximum. Preferred examples of the substituent for the substituted aryl group are a halogen atom, a nitro group, an alkyl group-containing 12 carbon atoms maximum, an alkoxy group-containing 12 carbon atoms maximum, an aryloxy group-containing at most 12 carbon atoms, an alkylamino group-containing 12 carbon atoms maximum, a dialkylamino group-containing 12 carbon atoms maximum, and a diarylamino group-containing 12 carbon atoms maximum. $Z^{21-}$ has the same meaning as $Z^{11-}$, representing a counter ion.

In formula (V), $R^{31}$, $R^{32}$ and $R^{33}$ may be the same or different, each representing an optionally-substituted hydrocarbon group-containing 20 carbon atoms maximum. Preferred examples of the substituent for the substituted hydrocarbon group are a halogen atom, a nitro group, an alkyl group-containing at most 12 carbon atoms, an alkoxy group-containing 12 carbon atoms maximum, and an aryloxy group-containing 12 carbon atoms maximum. $Z^{31-}$ is synonymous in meaning to $Z^{11-}$, representing a counter ion.

Examples of onium salts indicated by formula (III) [OI-1] to [OI-10]; of onium salts indicated by formula (IV), [ON-1] to [ON-5]; and of onium salts indicated by formula (V), [OS-1] to [OS-7], are shown below. These are preferred for use in the invention.

[OI-1]

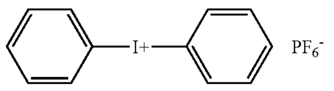

[OI-2]

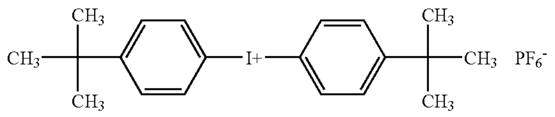

[OI-3]

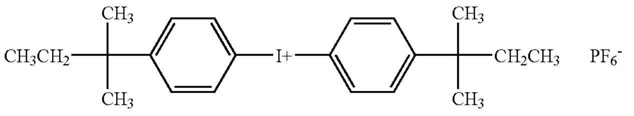

[OI-4]

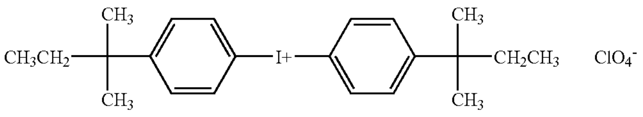

-continued
[OI-5]
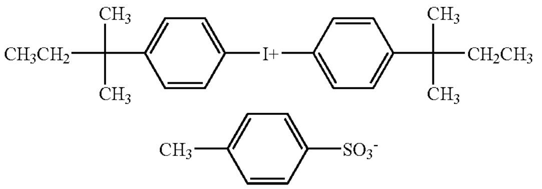
[OI-6
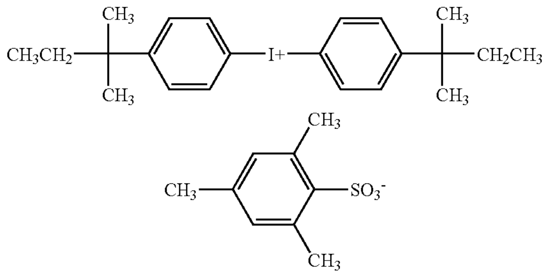
[OI-7]
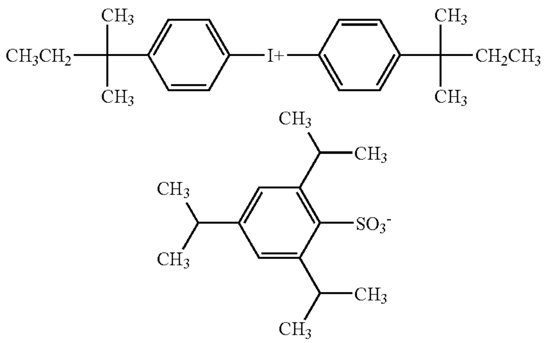
[OI-8]
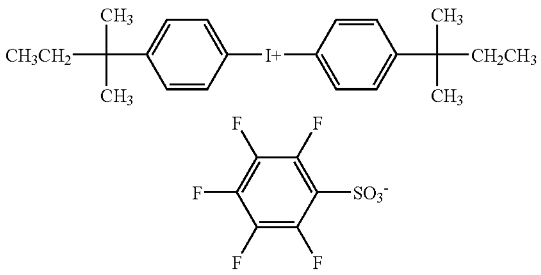
[OI-9]
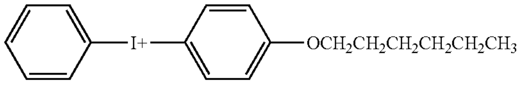
[OI-10]
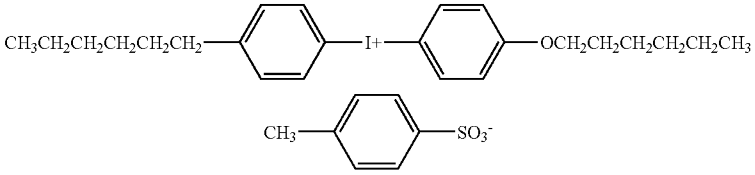
[ON-1]
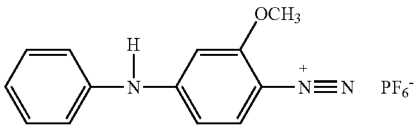
[ON-2]
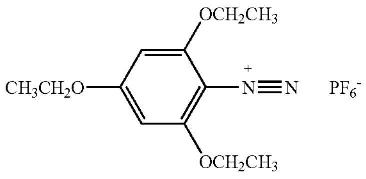
[ON-3]
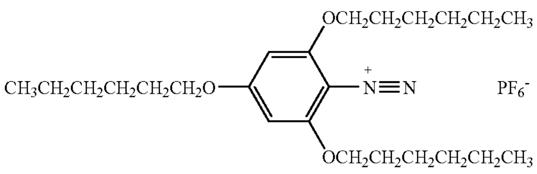
[ON-4]
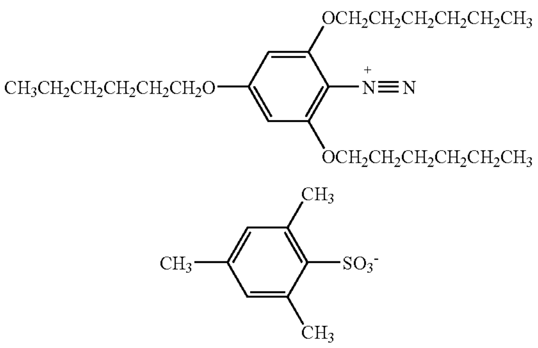

-continued
[ON-5]
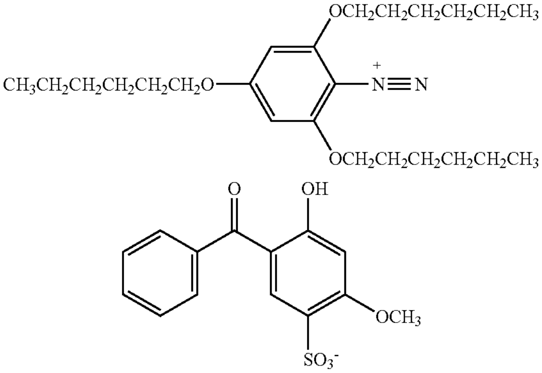
[OS-1]
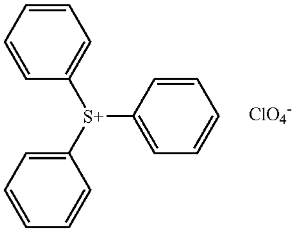
[OS-2]
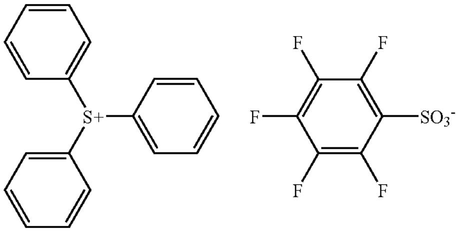
[OS-3]
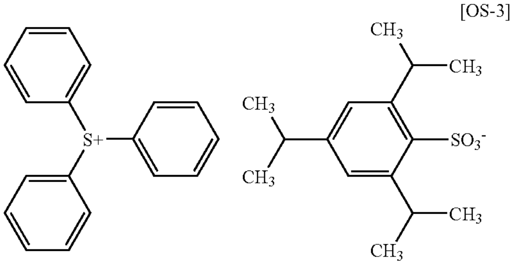
[OS-4]
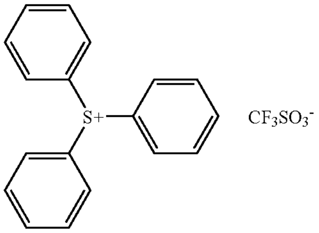
[OS-5
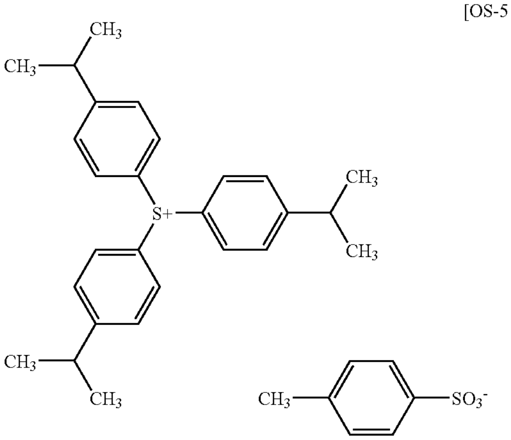
[OS-6]
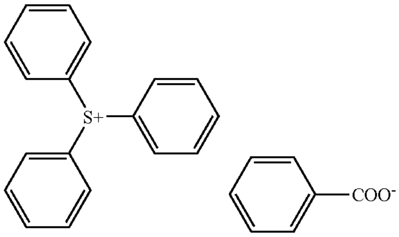
[OS-7]
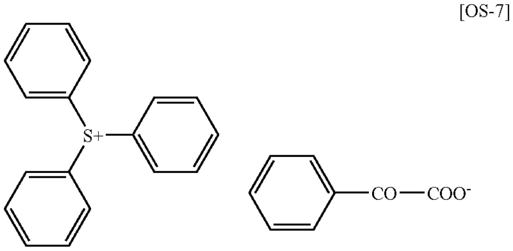

The preferred radical generator of the invention has a peak absorption at 400 nm or shorter, more preferably at 360 nm or shorter. When the range of the peak absorption of the radical generator is arranged within the range of UV light, the planographic printing plate precursor of the invention can be processed under white light.

The amount of the radical generator added to the recording layer of the invention can range from 0.1 to 50% by weight of the total solid content of the layer, preferably from 0.5 to 30% by weight, more preferably from 1 to 20% by weight. If the amount of the radical generator is smaller than 0.1% by weight, the sensitivity of the layer will be low; but if larger than 50% by weight, the non-image area of the prints during printing will be stained. One or a combination of two or more types of radical generators may be used. It may be added to one recording layer along with the other constituent components therein, or it may be added to a different layer formed separately from the recording layer in addition to being added to the recording layer.

Radical-Polymerizing Compound:

The radical-polymerizing compound used in the negative recording layer of the invention has at least one ethylenic unsaturated double bond in the molecule, and is selected from compounds having at least one, preferably at least two, terminal ethylenic unsaturated bonds in the molecule. These compound groups are well known in the art, and any of them are usable herein without specific limitations. They have various chemical forms, including monomers, prepolymers (e.g., dimers, trimers, oligomers), and their mixtures and copolymers. Examples of monomers and their copolymers are unsaturated carboxylic acids (e.g., acrylic acid, methacrylic acid, itaconic acid, crotonic acid, isocrotonic acid, maleic acid), and their esters and amides. Preferred are esters of unsaturated carboxylic acids with aliphatic polyalcohols; and amides of unsaturated carboxylic acids with aliphatic polyamines. Also preferred are adducts of unsaturated carboxylates or amides having a nucleophilic substituent of, for example, hydroxyl, amino or mercapto groups, with monofunctional or polyfunctional isocyanates or epoxides; and dehydrated condensates thereof with monofunctional or polyfunctional carboxylic acids. Also preferred are adducts of unsaturated carboxylates or amides having an electrophilic substituent of, for example, isocyanate or epoxy groups, with monofunctional or polyfunctional alcohols, amines or thiols; and substituting reaction products of unsaturated carboxylates or amides having a leaving substituent of, for example, halogens or tosyloxy groups, with monofunctional or polyfunctional alcohols, amines or thiols. Also usable herein are other compound groups of unsaturated phosphonic acids, styrenes or vinyl ethers, in place of the unsaturated carboxylic acids.

Examples of esters of aliphatic polyalcohols with unsaturated carboxylic acids for the radical-polymerizing compound for use herein are stated below. Acrylates include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomers.

Methacrylates include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy)phenyl] dimethylmethane, bis-[p-(methacryloxyethoxy)phenyl]dimethylmethane.

Itaconates include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate.

Crotonates include ethylene glycol dicrotonate, tetramethylene glycol dicrotonate, pentaerythritol dicrotonate, sorbitol tetracrotonate.

Isocrotonates include ethylene glycol diisocrotonate, pentaerythritol diisocrotonate, sorbitol tetraisocrotonate.

Maleates include ethylene glycol dimaleate, triethylene glycol dimaleate, pentaerythritol dimaleate, sorbitol tetramaleate.

Other esters also preferred for use herein are aliphatic alcohol esters such as those described in JP-B Nos. 46-27926, 51-47334, JP-A No. 57-196231; aromatic-skeleton containing esters as in JP-A Nos. 59-5240, 59-5241, 2-226149; and amino-containing esters as in JP-A No. 1-165613.

Examples of amide monomers of aliphatic polyamines and unsaturated carboxylic acids that are usable herein are methylenebis-acrylamide, methylenebis-methacrylamide, 1,6-hexamethylenebis-acrylamide, 1,6-hexamethylenebis-methacrylamide, diethylenetriamine-trisacrylamide, xylylenebis-acrylamide, and xylylenebis-methacrylamide.

Other amide monomers also preferred for use herein are those having a cyclohexylene structure, as in JP-B No. 54-21726.

Also preferred are urethane-type addition-polymerizing compounds that are obtained through addition reaction of isocyanates with hydroxyl compounds. Examples are vinylurethanes having at least two polymerizing vinyl groups in one molecule, which are produced through addition reaction of polyisocyanate compounds having at least two isocyanate groups in one molecule with hydroxyl-containing vinyl monomers of the following formula (VI), as for example, in JP-B No. 48-41708.

$$CH_2{=}C(R^{41})COOCH_2CH(R^{42})OH \qquad (VI)$$

wherein $R^{41}$ and $R^{42}$ each represent H or $CH_3$.

Also preferred for use herein are urethane acrylates such as those described in JP-A No. 51-37193, and JP-B Nos. 2-32293, 2-16765; and ethylene oxide skeleton-containing urethane compounds as in JP-B Nos. 58-49860, 56-17654, 62-39417, 62-39418.

Also usable herein are addition-polymerizing compounds having an amino structure or sulfido structure in the molecule, such as those described in JP-A Nos. 63-277653, 63-260909, 1-105238.

Other examples usable herein are polyfunctional acrylates and methacrylates such as polyester acrylates, and epoxy acrylates produced through reaction of epoxy resins with (meth)acrylic acids, as for example, in JP-A No. 48-64183, and JP-B Nos. 49-43191, 52-30490. Also usable are specific unsaturated compounds as in JP-B Nos. 46-43946, 1-40337 and 1-40336; and vinylphosphonic acids as in JP-A No. 2-25493. In certain cases, perfluoroalkyl-containing compounds as described in JP-A No. 61-22048 may be preferred. Also usable herein are photo-curable monomers and oligomers disclosed in "*The Journal of the Adhesive Association of Japan*", Vol. 20, No. 7. pp. 300–308 (1984).

Detailed use of these radical-polymerizing compounds of the invention, including the type of compound used, whether to use the compounds singly or in combination, and how much compound to add to the recording layer, may be arbitrarily determined in accordance with the performance plan of a final recording material. With respect to the sensitivity of the printing plate precursor, radical-polymerizing compounds having many unsaturated groups in one molecule are preferred. In many cases, difunctional or polyfunctional compounds are preferred. On the other hand, in order to increase the mechanical strength of the image area, that is, the mechanical strength of the cured film of the printing plate, trifunctional or polyfunctional compounds are preferred. Combining various radical-polymerizing compounds that differ in the number of the functional groups therein and in the type of the polymerizing groups therein (for example, acrylates, methacrylates, styrenes, vinyl ethers) is effective for enhancing both the sensitivity of the printing plate precursor and the mechanical strength of the image area of the cured film of the printing plate. Compounds having a large molecular weight and compounds having a high degree of hydrophobicity will ensure high sensitivity and high film strength, but they are often undesirable as they do not process well at high development speeds and often deposit in developers. It is also important to consider compatibility and dispersibility as related to the other components of the recording layer (e.g., binder polymers, polymerization initiators, colorants) when selecting and using radical-polymerizing compounds. For example, using low-purity compounds or combining two or more different compounds may improve the compatibility of the compounds with the other components. Compounds having a specific structure are also selected for improving the adhesiveness of the recording layer to the support and to the overcoat layer. In general, the compounding ratio of the radical-polymerizing compound in the recording layer is preferably larger for a higher layer sensitivity. However, if it is too large, an unfavorable phase separation will occur in the coating liquid for the layer, and the layer will become sticky and interfere with the smooth production of the printing plate precursor (for example, the components of the recording layer will transfer and adhere to unintended areas), and insoluble solids will deposit in developers. In view of these facts, the preferred compounding ratio of the radical-polymerizing compound in the recording layer should in most cases range between 5 and 80% by weight, more preferably between 20 and 75% by weight of all the components of the composition for the layer. Different types of radical-polymerizing compounds may be used in the recording layer either singly or in combination. Regarding the method of using the radical-polymerizing compounds of the invention, the structure, the compounding ratio, and the amount of the compounds to be used in the recording layer may be arbitrarily selected according to the degree of polymerization retardation of the compounds by oxygen, the resolution of the recording layer containing the compound, the fogging resistance thereof the refractive index change thereof and the surface adhesiveness thereof. As the case requires, overcoat layers or undercoat layers may be disposed on or below the recording layer.

Photo-Thermal Converting Agent (IR Absorbent):

The photo-thermal converting agent in the negative recording layer of the invention has no particular limitations for its absorption wavelength range, and it may be any having the function of converting the light which it has absorbed into heat for image formation in the layer.

In the case where the negative recording layer is exposed to an IR laser for image formation thereon, the photo-thermal converting agent in the layer shall have the function of absorbing IR light to which the layer is exposed and converting the light into heat. This is hereinafter referred to as IR absorbent. For an IR absorbent of this type, IR-absorbing dyes and pigments that have an absorption peak in a wavelength range between 760 nm and 1200 nm are preferred. The IR absorbent is described in detail hereinunder.

The IR absorbent dyes of the invention may be any of the commercially available or other known ones, as for example, those described in "*The Dye Handbook*" (by the Association of Organic Synthetic Chemistry of Japan, 1970). Specific examples are azo dyes, metal-complex azo dyes, pyrazolonazo dyes, naphthoquinone dyes, anthraquinone dyes, phthalocyanine dyes, carbonium dyes, quinonimine dyes, methine dyes, cyanine dyes, squalilium dyes, pyrylium salts, metal thiolate complexes, oxonole dyes, diimmonium dyes, aminium dyes and croconium dyes.

Preferred dyes for use herein are cyanine dyes such as those described in JP-A Nos. 58-125246, 59-84356, 59-202829, 60-78787; methine dyes in JP-A Nos. 58-173696, 58-181690, 58-194595; naphthoquinone dyes in JP-A Nos. 58-112793, 58-224793, 59-48187, 59-73996, 60-52940, 60-63744; squalilium dyes in JP-A No. 58-112792; and cyanine dyes in British Patent 434,875.

Also preferred for use herein are near-IR absorbing sensitizers such as those described in U.S. Pat. No. 5,156,938; substituted arylbenzo(thio)pyrylium salts in U.S. Pat. No. 3,881,924; trimethine-thiapyrylium salts in JP-A No. 57-142645 (U.S. Pat. No. 4,327,169); pyrylium compounds in JP-A Nos. 58-181051, 58-220143, 59-41363, 59-84248, 59-84249, 59-146063, 59-146061; cyanine dyes in JP-A No. 59-216146; pentamethine-thiopyrylium salts in U.S. Pat. No. 4,283,475; and pyrylium compounds in JP-B Nos. 5-13514, 5-19702.

Other preferred examples of dyes are the near-IR absorbing dyes of formulae (I) and (II) in U.S. Pat. No. 4,756,993.

Of these dyes, cyanine dyes, phthalocyanine dyes, oxonole dyes, squalilium dyes, pyrylium salts, thiopyrylium dyes, and nickel-thiolate complexes are especially preferred. The dyes of general formulae (a) to (e) shown below are more preferred as they ensure good photo-thermal conversion efficiency. Most preferred are the cyanine dyes of formula (a) as they ensure high polymerization activity when used in the polymerizable composition of the invention, and as they are stable and economical.

Formula (a)

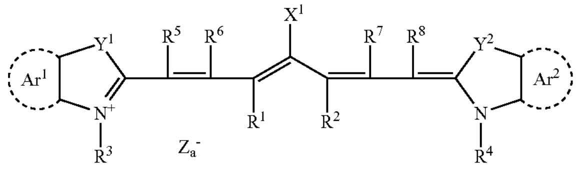

In formula (a), $X^1$ represents a hydrogen atom, a halogen atom, —$NPh_2$, $X^2$-$L^1$, or a group of

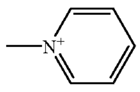

$X^2$ represents an oxygen or sulfur atom; $L^1$ represents a hydrocarbon group-containing from 1 to 12 carbon atoms, or a hetero atom-containing aromatic group, or a hetero atom-containing hydrocarbon group-containing from 1 to 12 carbon atoms. The hetero atom includes N, S, O, halogen atoms, and Se.

$R^1$ and $R^2$ each independently represent a hydrocarbon group-containing from 1 to 12 carbon atoms. In view of the storage stability of the coating liquid for the recording layer containing the dye, $R^1$ and $R^2$ are each preferably a hydrocarbon group-containing at least 2 carbon atoms; more preferably, $R^1$ and $R^2$ are bonded to each other to form a 5-membered or 6-membered ring.

$Ar^1$ and $Ar^2$ may be the same or different, and each represents an optionally-substituted aromatic hydrocarbon group. Preferably, the aromatic hydrocarbon group is a benzene ring or a naphthalene ring. Preferred substituents for them are a hydrocarbon group-containing 12 carbon atoms maximum, a halogen atom, and an alkoxy group-containing 12 carbon atoms maximum. $Y^1$ and $Y^2$ may be the same or different, and each represents a sulfur atom, or a dialkylmethylene group-containing 12 carbon atoms maximum. $R^1$ and $R^4$ may be the same or different, and each represents an optionally-substituted hydrocarbon group-containing 20 carbon atoms maximum. Preferred substituents for them are an alkoxy group-containing 12 carbon atoms maximum, a carboxyl group, and a sulfo group. $R^5$, $R^6$, $R^7$ and $R^8$ may be the same or different, and each represents a hydrogen atom, or a hydrocarbon group-containing 12 carbon atoms maximum. Hydrogen atoms are here preferred, as the starting materials for the dyes are easily available. $Z_a^-$ represents a counter anion. However, in the case where any of $R^1$ to $R^8$ is substituted with a sulfo group, $Z_a^-$ is unnecessary. In view of the storage stability of the coating liquid for the recording layer containing the dye, $Z_a^-$ is preferably a halide ion, a perchlorate ion, a tetrafluoroborate ion, a hexafluorophosphate ion, or a sulfonate ion, and more preferably a perchlorate ion, a hexafluorophosphate ion or an arylsulfonate ion.

Examples of the preferred cyanine dyes of formula (a) are shown below. In addition to these, the dyes described in paragraphs [0017] to [0019] of Japanese Patent Application No. 11-310623, paragraphs [0012] to [0038] of Japanese Patent Application No. 2000-224031, and paragraphs [0012] to [0023] of Japanese Patent Application No. 2000-211147 are also preferred.

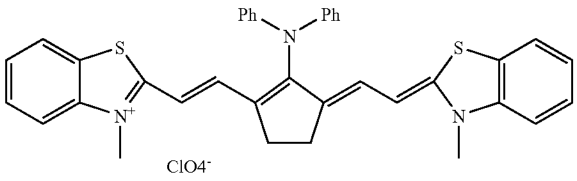

-continued

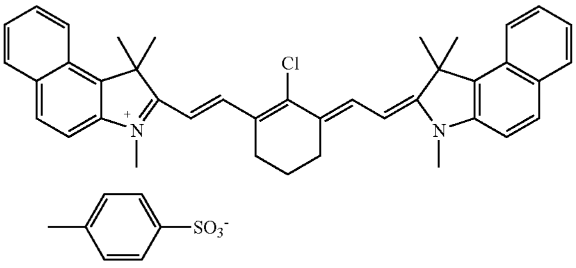

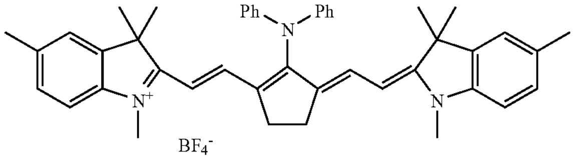

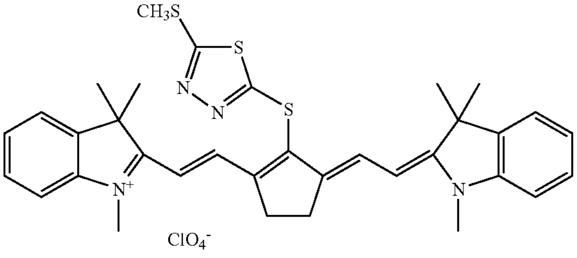

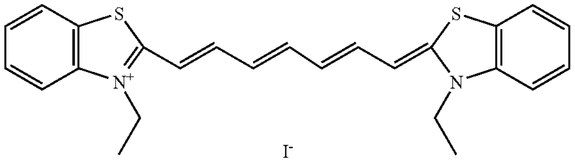

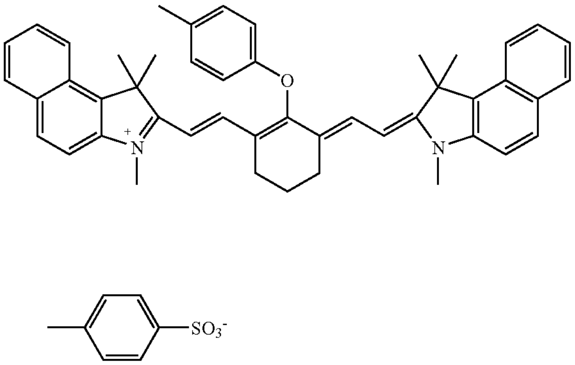

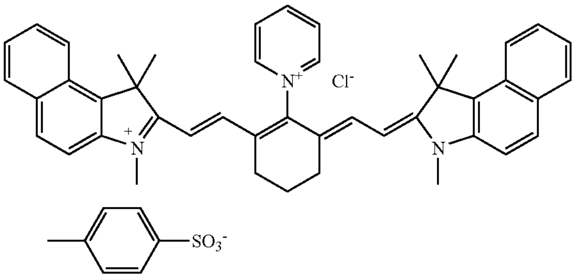

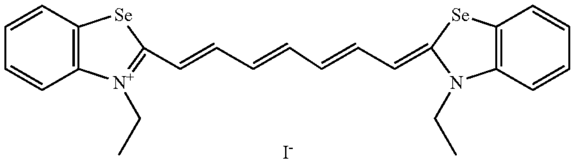

-continued

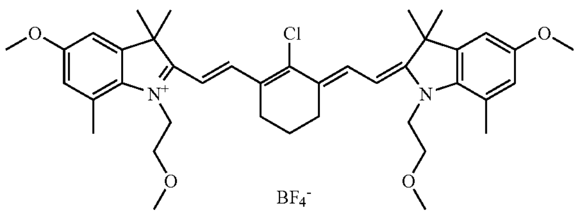

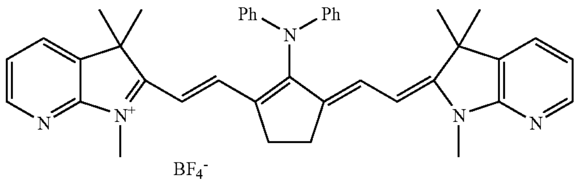

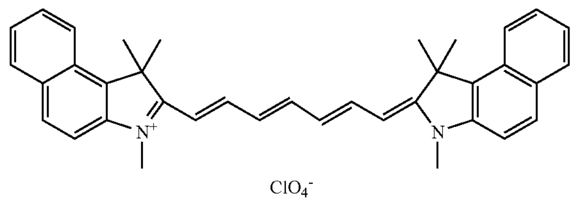

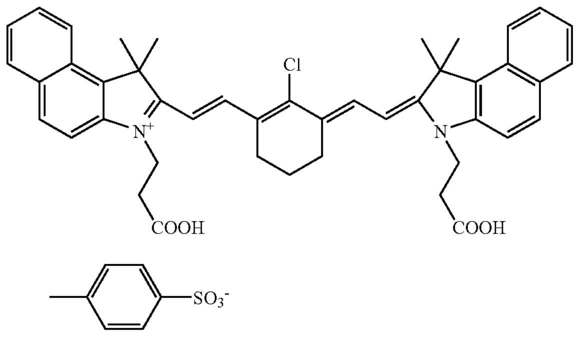

-continued

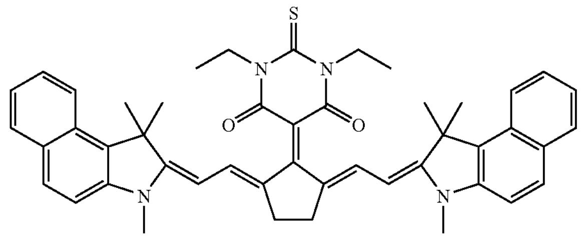

Formula (b)

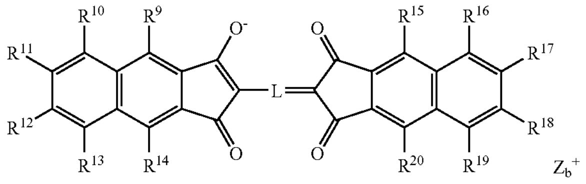

In formula (b), L represents a methine chain having at least 7 conjugated carbon atoms, and the methine chain may be optionally substituted. The substituents, if any, in the methine chain may be bonded to each other to form a cyclic structure. $Z_b^+$ represents a counter cation. Preferred examples of the counter cation are ammonium, iodonium, sulfonium, phosphonium, pyridinium, and alkali metal cations ($Ni^+$, $K^+$, $Li^+$). $R^9$ to $R^{14}$, and $R^{15}$ to $R^{20}$ each independently represent a hydrogen atom, or a substituent selected from a halogen atom, a cyano group, an alkyl group, an aryl group, an alkenyl group, an alkynyl group, a carbonyl group, a thio group, a sulfonyl group, a sulfinyl group, an oxy group and an amino group, or a substituent of two or three of the groups combined; and they may be bonded to each other to form a cyclic structure. Of the dyes of formula (b), those in which L is a methine chain having 7 conjugated carbon atoms, and $R^9$ to $R^{14}$ and $R^{15}$ to $R^{20}$ are all hydrogen atoms are preferred, as they are easily available and effective.

Examples of the preferred dyes of formula (b) are shown below.

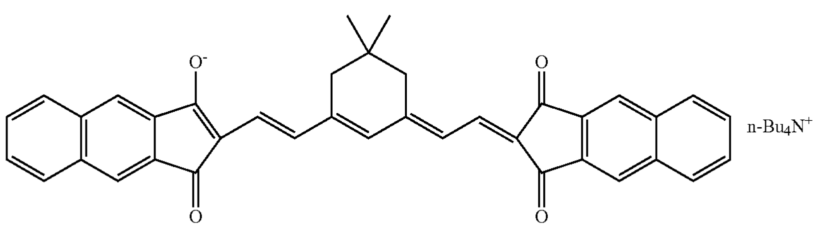

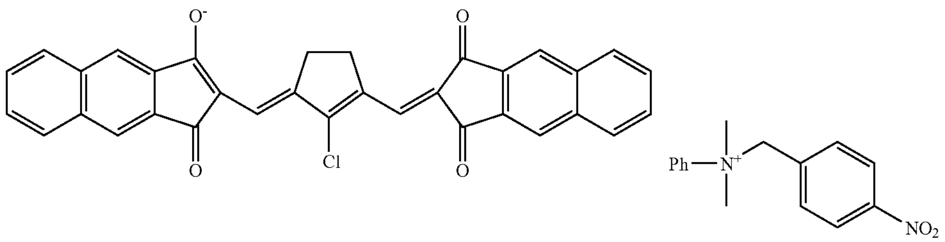

-continued

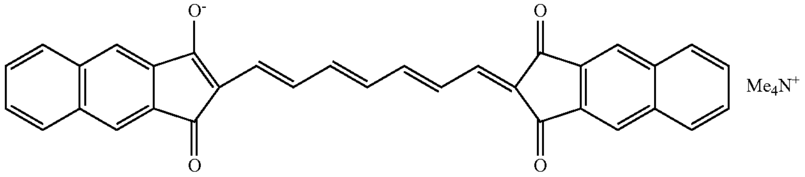

Formula (c)

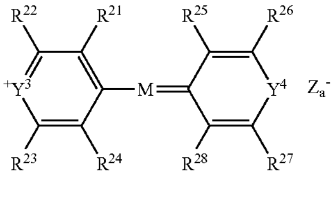

In formula (c), $Y^3$ and $Y^4$ each represent an oxygen atom, a sulfur atom, a selenium atom, or a tellurium atom; M represents a methine chain having at least 5 conjugated carbon atoms; $R^{21}$ to $R^{24}$, and $R^{25}$ to $R^{28}$ may be the same or different, each representing a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group; $Z_a^-$ represents a counter anion, synonymous in meaning with that of $Z_a^-$ in formula (a).

Examples of the preferred dyes of formula (c) are shown below.

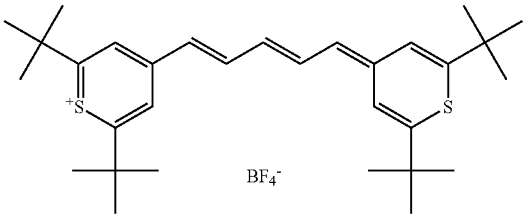

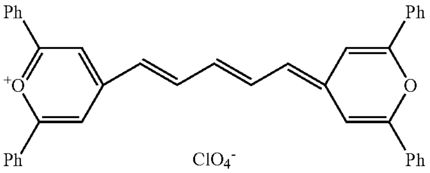

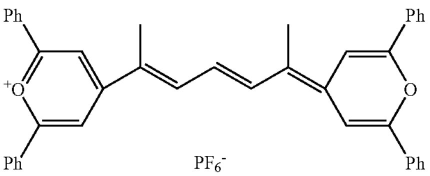

-continued

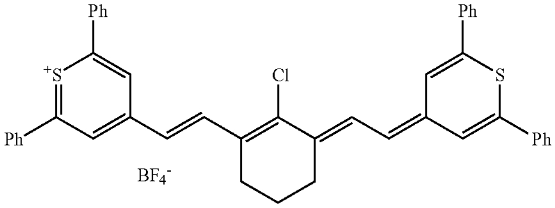

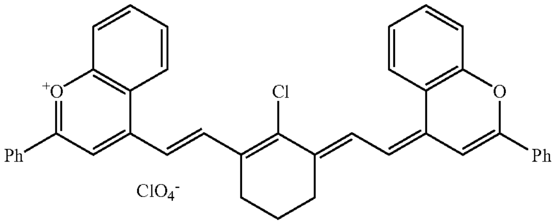

Formula (d)

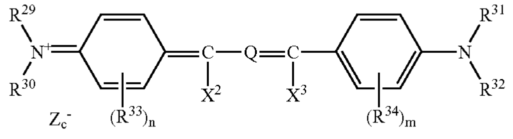

In formula (d), $R^{29}$ to $R^{32}$ each independently represent a hydrogen atom, an alkyl group or an aryl group; $R^{33}$ and $R^{34}$ each independently represent an alkyl group, a substituted oxy group, or a halogen atom; n and m each independently indicate an integer of from 0 to 4. $R^{29}$ and $R^{30}$, and $R^{31}$ and $R^{32}$ may be bonded to each other to form a ring. $R^{29}$ and/or $R^{30}$ may be bonded to $R^{33}$, and $R^{31}$ and/or $R^{32}$ to $R^{34}$ to form a ring. $R^{33}$'s or $R^{34}$'s, if a plural number of them exists, may be bonded to each other to form a ring. $X^2$ and $X^3$ each independently represent a hydrogen atom, an alkyl group or an aryl group; and at least one of $X^2$ and $X^3$ is a hydrogen atom or an alkyl group. Q represents an optionally-substituted trimethine or pentamethine group, and it may form a cyclic structure along with a divalent organic group. $Z_c^-$ represents a counter anion, synonymous in meaning with that of $Z_a^-$ in formula (a).

Examples of the preferred dyes of formula (d) are shown below.

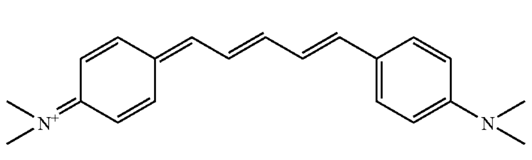

$ClO_4^-$

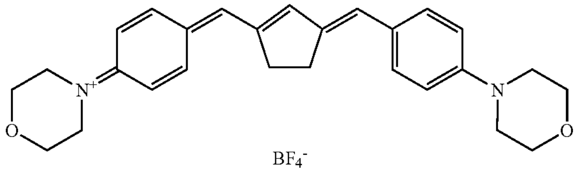

$BF_4^-$

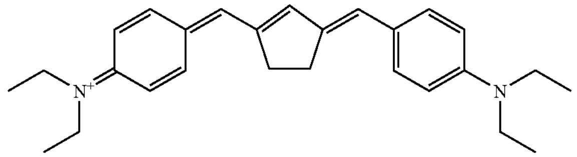

$PF_6^-$

Formula (e)

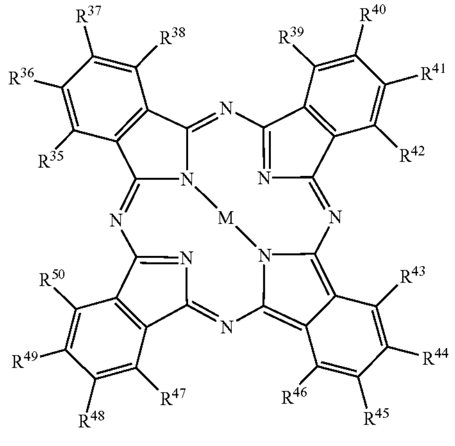

In formula (e), $R^{35}$ to $R^{50}$ each independently represent a hydrogen atom, a halogen atom, a cyano group, an alkyl group, an aryl group, an alkenyl group, an alkynyl group, a hydroxyl group, a carbonyl group, a thio group, a sulfonyl group, a sulfinyl group, an oxy group, an amino group, or an onium salt structure, which may be optionally substituted. M represents two hydrogen atoms, or a metal atom, a halometal group or an oxymetal group, in which the metal atom includes atoms of Groups IA, IIA, IIIB and IVB, and transition metals and lanthanoid elements of Periods 1, 2 and 3 of the Periodic Table. Of these, copper, magnesium, iron, zinc, cobalt, aluminium, titanium and vanadium are especially preferred.

Examples of the preferred dyes of formula (e) are shown below.

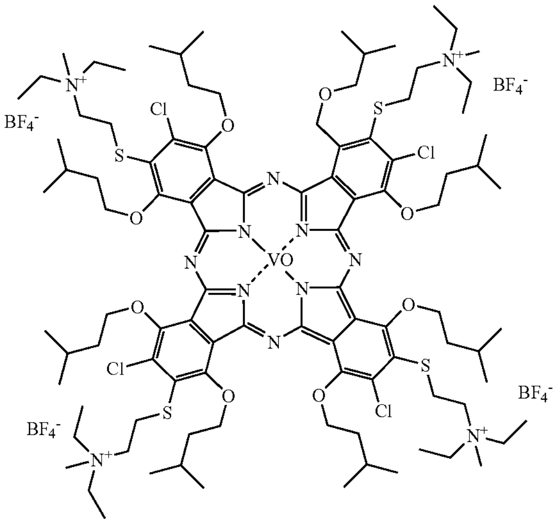

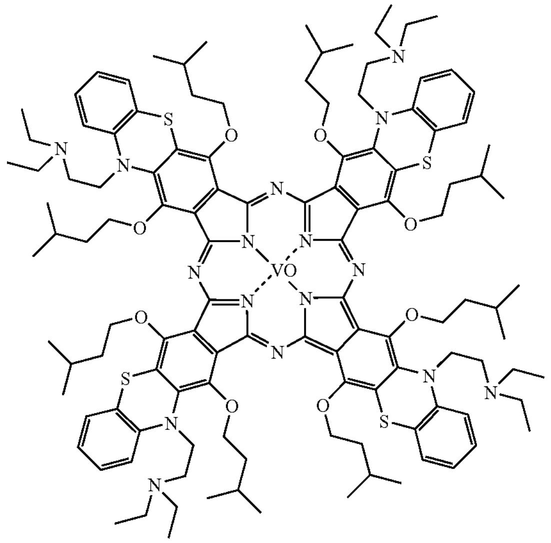

The pigments for use as the IR absorbent of the invention may be any of the commercially-available or other known ones, as for example, those described in "*Color Index* (*C.I.*) *Handbook; Latest Pigment Handbook*", (edited by the Pigment Technology Association of Japan, 1977); "*Latest Pigment Application Technology*", (published by CMC, 1986); and "*Printing Ink Technology*", (published by CMC, 1984).

Various types of pigments are usable herein, including black pigments, yellow pigments, orange pigments, brown pigments, red pigments, violet pigments, blue pigments, green pigments, fluorescent pigments, metal powder pigments, and other polymer-bonded pigments. Specifically, they include insoluble azo pigments, azo-lake pigments, condensed azo pigments, chelate-azo pigments, phthalocyanine pigments, anthraquinone pigments, perylene and perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black. of the above, carbon black is preferred.

These pigments may be used without being surface-treated, or they may be surface-treated. Surface treatment includes a method of coating their surfaces with resin or wax; a method of adhering a surfactant thereto; a method of bonding a reactive substance (e.g., silane coupling agent, epoxy compound, polyisocyanate) to their surfaces. Surface treatment methods are described in "*Properties and Applications of Metal Soap*", (by Miyuki Publishing); "*Printing Ink Technology*", (published by CMC, 1984); and "*Latest Pigment Application Technology*", (published by CMC, 1986).

The particle size of the pigment preferably falls between 0.01 μm and 10 μm, more preferably between 0.05 μm and 1 μm, even more preferably between 0.1 μm and 1 μm. If the particle size is smaller than 0.01 μm, pigment dispersion will be unstable in the coating liquid for the recording layer. If it is larger than 10 μm, the recording layer will not be uniform and thus not preferable.

Any known dispersion technique such as is used in ordinary ink production or toner production is employable for dispersing the pigment. Examples of dispersing machines include ultrasonic dispersers, sand mills, attritors, pearl mills, super mills, ball mills, impellers, dispersers, KD mills, colloid mills, dynatrons, three-roll mills, and pressure kneaders. A detailed account of pigment dispersion is described in "*Latest Pigment Application Technology*", (published by CMC, 1986).

When a pigment or dye is added to the recording layer, its amount may be from 0.01 to 50% by weight, preferably from 0.1 to 10% by weight of the total solid content of the layer. More preferably, the amount of the dye is from 0.5 to 10% by weight, and that of the pigment is from 0.1 to 10% by weight. If the amount of the pigment or dye in the recording layer is smaller than 0.01% by weight, the sensitivity of the layer will be low. If it is larger than 50% by weight, the recording layer will lose its uniformity and its durability will also be poor.

Other Components:

The negative recording layer of the invention may contain various additives such as those described below if desired.

Binder Polymer:

The negative recording layer of the invention preferably contains a binder polymer for improving the film characteristics of the layer. Linear organic polymers are preferred for the binder polymer. The linear organic polymers may be any known ones. Those that are soluble or swellable in water or weak alkaline water for enabling the development of the plate precursor are preferred. The linear organic polymers serve as film-forming agents for the recording layer and can be selected according to the application for the development of the plate precursor, be it with water, weak alkaline water, or an organic solvent developer. For example, when a water-soluble organic polymer is employed therein, the plate precursor can be developed with water. The linear organic polymers may be radical polymers having a carboxylic acid group in the side branches, such as those described in JP-A No. 59-44615, JP-B Nos. 54-34327, 58-12577, 54-25957, JP-A Nos. 54-92723, 59-53836, 59-71048. They include methacrylic acid copolymers, acrylic acid copolymers, itaconic acid copolymers, crotonic acid copolymers, maleic acid copolymers, and semi-esters of maleic acid copolymers. In addition to these, acid cellulose derivatives having a carboxylic acid group in the side branches, as well as hydroxyl-containing polymer adducts with cyclic acid anhydrides are also usable herein.

Of the above, (meth)acrylic resins having a benzyl or allyl group and a carboxyl group in the side branches; and alkali-soluble resins having a double bond in the side branches, such as those described in JP-A No. 2000-187322, are especially preferred for use herein as they ensure a good balance of film strength, sensitivity and developability.

Also preferred are urethane-type binder polymers having an acid group, such as those described in JP-B Nos. 7-12004, 7-120041, 7-120042, 8-12424, JP-A Nos. 63-287944, 63-287947, 1-271741, and Japanese Patent Application No. 10-116232, as they ensure extremely high mechanical strength, and therefore ensure good printing durability and low-exposure latitude.

In addition, polyvinyl pyrrolidone and polyethylene oxide are also preferred for water-soluble linear organic polymers for use herein. Alcohol-soluble nylons and polyethers of 2,2-bis(4-hydroxyphenyl)propane and epichlorohydrin are also preferable for increasing the mechanical strength of the cured film of the recording layer.

The weight-average molecular weight of the polymer is preferably at least 5,000, more preferably from 10,000 to 300,000. The number-average molecular weight of the polymer is preferably at least 1,000, more preferably from 2,000 to 250,000. The polydispersity (weight-average molecular weight/number-average molecular weight) of the polymer is preferably at least 1, more preferably from 1.1 to 10.

The polymer may be any form of random polymer, block polymer or graft polymer, but it is preferably a random polymer.

The polymer of the invention may be prepared by any known method. The solvent used in producing the polymer may be, for example, tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, or water. These solvents may be used either singly or in combination.

The radical polymerization initiator to be used in producing the polymer may be any known compound, including, for example, azo-type initiators and peroxide initiators.

The binder polymers of the invention may be used either singly or in combination. The amount of polymer added to the recording layer is preferably from 20 to 95% by weight, more preferably from 30 to 90% by weight of the total solid content of the layer. If the amount of the polymer added is smaller than 20% by weight, the mechanical strength of the image area in the processed plate will be insufficient. If it is larger than 95% by weight, no image can be formed on the recording layer. The compounding ratio of a compound having a radical-polymerizable ethylenic unsaturated double bond to the linear organic polymer in the recording layer is preferably between 1/9 and 7/3 by weight.

Other Additives:

The negative recording layer of the invention may contain other various compounds if desired. For example, it may contain a dye having high absorption in the visible light range, where the dye serves as an image colorant. Specific examples of such a dye include Oil Yellow #101, Oil Yellow #103, Oil Pink #312, Oil Green BG, Oil Blue BOS, Oil Blue #603, Oil Black BY, Oil Black BS, Oil Black T-505 (all trade names; manufactured by Orient Chemical Industry), Victoria Pure Blue, Crystal Violet (CI 42555), Methyl Violet (CI 42535), Ethyl Violet, Rhodamine B (CI 145170B), Malachite Green (CI 42000), Methylene Blue (CI 52015), as well as the dyes described in JP-A No. 62-293247. Also preferred for use herein are pigments such as phthalocyanine pigments, azo pigments, carbon black and titanium oxide.

These colorants facilitate differentiation of the image area from the non-image area in the image-formed plate, and so to add any of them to the recording layer is preferable. The amount of the dye that may be added to the recording layer is 0.01 to 10% by weight of the total solid content of the layer.

A small amount of a thermal polymerization inhibitor is preferably added to the recording layer for preventing unnecessary thermal polymerization of the radical-polymerizable ethylenic unsaturated double bond-containing compound in the layer while the layer is formed or while the plate precursor is stored. Suitable examples of the thermal polymerization inhibitor are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitroso-N-phenylhydroxylamine aluminium salt. The amount of the thermal polymerization inhibitor added to the layer preferably falls between about 0.01% by weight and about 5% by weight of the composition to form the layer. If desired, a higher fatty acid or its derivative having the ability to prevent polymerization retardation by oxygen, such as behenic acid or behenamide, may be added to the composition for the recording layer. The acid or acid derivative may be localized in the surface of the recording layer during the step of drying the layer. The amount of the higher fatty acid or its derivative in the composition is preferably between about 0.1% by weight and about 10% by weight of the composition.

The recording layer of the invention may contain any of nonionic surfactants described in JP-A Nos. 62-251740 and 3-208514, and ampholytic surfactants described in JP-A Nos. 59-121044 and 4-13149, for extending the stability in the processing of the precursor.

Examples of the nonionic surfactants are sorbitan tristearate, sorbitan monopalmitate, sorbitan trioleate, stearic monoglyceride, and polyoxyethylene nonylphenyl ether.

Examples of the ampholytic surfactants are alkyldi(aminoethyl)glycines, alkylpolyaminoethylglycine hydrochlorides, 2-alkyl-N-carboxyethyl-N-hydroxyethylimidazolium betaines, and N-tetradecyl-N,N-betaines (e.g., Amogen K, trade name, manufactured by Dai-ichi Kogyo).

The amount of the nonionic surfactant and the ampholytic surfactant in the recording layer of the planographic printing plate precursor is preferably from 0.05 to 15% by weight, more preferably from 0.1 to 5% by weight of the layer.

The recording layer in the invention may contain a plasticizer for making the layer flexible if desired. Examples of the plasticizer include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate.

Method of Fabricating Planographic Printing Plate Precursor

The negative planographic printing plate precursor of the invention may be formed by dissolving the above-mentioned components in a solvent and applying the resulting solution onto a support having a hydrophilic surface to form a negative recording layer thereon.

The solvent usable herein includes ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulforane, γ-butyrolactone, toluene and water. However, the invention is not limited by these examples. These solvents may be used either singly or in combination. The concentration of the constituent components (total solid content including additives) in the solvent is preferably from 1 to 50% by weight.

The dry weight (in terms of the solid content) of the recording layer varies, depending on the use thereof. In general, it is preferably from 0.5 $g/m^2$ to 5.0 $g/m^2$. Various coating methods are employable for forming the layer. Examples are bar coating, spin coating, spraying, curtain coating, dipping, air knife coating, blade coating and roll coating. The apparent sensitivity of the layer is higher when the coating amount thereof is lower. However, the layer has the function of recording images and so if the coated amount is too small, the film properties will deteriorate.

Protective Layer (Overcoat Layer):

In the negative planographic printing plate precursor of the invention, a protective layer (overcoat layer) may be formed on the negative recording layer if desired. In general, the recording layer is exposed to light in usual atmospheric conditions, and so it is desirable for the layer to be protected by a protective layer overlying it. The protective layer formed on the recording layer acts to prevent oxygen and basic substances such as low-molecular compounds (as these low-molecular compounds are in the air and retard the image formation on the recording layer) from contaminating the recording layer. The necessary characteristic of the protective layer, therefore, is that little oxygen and other low-molecular compounds permeate through the layer. In addition, it is desirable that the light transmission through the protective layer is high, the adhesiveness of the protective layer to the underlying recording layer is good, and that the protective layer is easily removed by development after exposure to light.

Various protective layers have heretofore been planned, as, for example, described in detail in U.S. Pat. No. 3,458,311 and JP-A No. 55-49729. A water-soluble polymer compound having a relatively high degree of crystallinity is an example of a comparatively good material for the protective layer. Specific examples are polyvinyl alcohol, polyvinyl pyrrolidone, acidic celluloses, gelatin, gum arabic, and polyacrylic acid. Of the above, polyvinyl alcohol as the essential component of the protective layer produces the best results for its basic characteristics of blocking out oxygen and being easily removed by development. Polyvinyl alcohol maybe partially esterified, etherified and/or acetallized so far as it includes unsubstituted vinyl alcohol units that are necessary for its oxygen barrier characteristics and for its solubility in water. Also, it may be partially copolymerized if desired.

For example, polyvinyl alcohol hydrolyzed at a degree of 71 to 100% and having a molecular weight of 300 to 2400 may be used for the protective layer. Examples are PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (all tradenames for polyvinyl alcohol, manufactured by Kuraray).

The amount of constituent components used to form the protective layer (e.g., the type of PVA to be used, the presence or absence of additives in the layer), is to be determined in consideration of the oxygen barrier property of the layer, the removability of the layer by development, and also the fogging resistance, the adhesiveness, and the scratch resistance of the layer. In general, it is desirable that PVA hydrolyzed to a higher degree (PVA in which the unsubstituted vinyl alcohol unit content is higher) is used to form a thicker protective layer, as the oxygen barrier property of the layer is then better and the sensitivity thereof is higher. However, if the ability to block out oxygen is enhanced too much, it creates the problem of unnecessary polymerization occuring in the recording layer when the plate precursor is produced or stored before processed, or when imagewise exposed, so that the recording layer will be undesirably fogged or the image line formed through exposure will be thickened. In addition, the adhesiveness of the protective layer to the image area of the recording layer and the scratch resistance of the protective layer are also extremely important. specifically, when a hydrophilic layer of a water-soluble polymer (the protective layer in this case) is laminated over an oleophilic polymerizing layer (that is, the recording layer), the hydrophilic polymer layer often peels off from the oleophilic polymerizing layer as the adhesiveness between the two is too low. If so, poor polymerization of the part which has peeled due to oxygen penetration results in a defect in curing.

To improve the adhesiveness between the two layers, various proposals have heretofore been made. For example, in U.S. Pat. No. 292,501 and U.S. Pat. No. 44,563, 20 to 60% by weight of an acrylic emulsion or a water-insoluble vinyl pyrrolidone-vinyl acetate copolymer is added to a hydrophilic polymer of essentially polyvinyl alcohol, and a layer of the resulting mixture is laminated over a polymerizing layer to ensure good adhesiveness between the two layers. Any such techniques as disclosed in these U.S. patent specifications may be applied to the protective layer of the invention. This kind of method for forming the protective layer is described in detail in, for example, U.S. Pat. No. 3,458,311 and JP-A No. 55-49729.

The protective layer may be modified to make it have additional functions. For example, the addition of a colorant (e.g., water-soluble dye) for excellent transmission of the exposure light (for the negative planographic printing plate precursor of the invention an IR light of 760 nm to 1200 nm or so), and for efficiently absorbing other light not related to the image formation, broadens the safe light capability of the printing plate precursor without lowering the sensitivity of the underlying recording layer.

The negative planographic printing plate precursor of the invention formed in the above manner is generally imagewise exposed and then developed.

The active rays to which the precursor is imagewise exposed include the light sources of mercury lamps, metal halide lamps, xenon lamps, chemical lamps, and carbon arc lamps. Radiation may be by X rays, ion beams, and far IR rays. Also usable are i rays, and high-density energy beams (laser beams) Helium-neon, argon, krypton, helium-cadmium, and KrF excimer, are known lasers that can be used. In the invention, light sources that emit light in a near-IR to IR range are preferred, and solid and semiconductor lasers are more preferred.

The laser power is preferably at least 100 mW. A multi-beam laser device is preferred for shortening the exposure time. It is also preferred that the exposure time per pixel is not longer than 20 μsec. The energy applied to the negative recording layer is preferably from 10 to 300 mJ/$cm^2$.

After being imagewise exposed, the negative planographic printing plate precursor of the invention is preferably developed with water or an aqueous alkaline solution.

The printing plate precursor of the invention may be directly developed immediately after being exposed to the laser. However, it is also possible to heat it between the laser exposure step and the development step. The exposed precursor is preferably heated at a temperature falling between 80° C. and 150° C. for a period of time between 10 seconds and 5 minutes. Heating may reduce the laser energy necessary for the image-forming exposure of the plate precursor.

The developer for the exposed precursor of the invention is preferably an aqueous alkaline solution. More preferably, the aqueous alkaline solution has a pH level between 10.5 and 12.5, and even more preferably between 11.0 and 12.5. If the pH level is lower than 10.5, the non-image area of the developed plate has a tendency to stain; If it is larger than 12.5, the mechanical strength of the image area of the developed plate will be lower.

The developer and the replenisher for the development may be any known aqueous alkaline solutions. Examples are inorganic alkali salts such as sodium and potassium silicates; sodium, potassium and ammonium tertiary phosphates; sodium, potassium and ammonium secondary phosphates; sodium, potassium and ammonium carbonates; sodium, potassium and ammonium hydrogencarbonates; sodium, potassium and ammonium borates; and sodium, ammonium, potassium and lithium hydroxides. Also usable are organic alkalis such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkalis may be used either singly or in combination.

When an automatic processor is used for development, a replenisher, either the same as the developer originally in the development tank, or to which an aqueous solution having a higher alkali concentration is added, is used. With a processor, a large number of planographic printing plate precursors can be continuously processed even though the developer in the development tank is not exchanged for a long period of time The application of this replenishing system is preferable for the present invention.

Various surfactants and organic solvents may be added to the developer and the replenisher if desired for accelerating or retarding development, for dispersing developer wastes, and for enhancing the affinity of the image area of the developed printing plate to ink.

Preferably, the developer contains from 1 to 20% by weight, more preferably from 3 to 10% by weight of a surfactant. If the surfactant content of the developer is smaller than 1% by weight, the developability suffers. If it is larger than 20% by weight, the abrasion resistance and the mechanical strength of the image area of the developed printing plate will be lower.

Anionic, cationic, nonionic or ampholytic surfactants are preferred. Examples include sodium lauryl alcohol sulfate, ammonium lauryl alcohol sulfate, and sodium octyl alcohol sulfate; alkylarylsulfonates such as sodium isopropylnaphthalenesulfonate, sodium isobutylnaphthalenesulfonate, sodium polyoxyethylene glycol mononaphthylethyl sulfate, sodium dodecylbenzenesulfonate, sodium metanitrobenzenesulfonate; higher alcohol sulfates having from 8 to 22 carbon atoms, such as secondary sodium alkylsulfates; salts of aliphatic alcohol phosphates such as sodium cetyl alcohol phosphate; alkylamide sulfonates such as $C_{17}H_{33}CON(CH_3)CH_2CH_2SO_3Na$; dibasic aliphatic ester sulfonates such as dioctyl sodiumsulfosuccinate, dihexyl sodiumsulfosuccinate; ammonium salts such as lauryltrimethylammonium chloride, lauryltrimethylammonium methosulfate; amine salts such as stearamidoethyldiethylamine acetate; polyalcohol esters such as monoesters of fatty acids with glycerol, and monoesters of fatty acids with pentaerythritol; and polyethylene glycol ethers such as polyethylene glycol mononaphthyl ether, polyethylene glycol mono(nonylphenol) ether.

The organic solvent in the developer or replenisher preferably has a solubility in water of about 10% by weight maximum, more preferably 5% by weight maximum. Examples include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol, and 3-methylcyclohexanol. Preferably, the organic solvent in the developer accounts for 1 to 5% by weight of the developer during actual use. The organic solvent content of the developer is closely correlated to the surfactant content thereof. With an increase in the organic solvent content of the developer, the surfactant content preferably increases also. If the amount of the organic solvent increases when that of the surfactant therein remains small, the organic solvent can not dissolve well in the developer. The result is that good developability cannot be ensured.

Other additives such as a defoaming agent and a water softener may be added to the developer and the replenisher if desired. Examples of the water softener include polyphosphates such as $Na_2P_2O_7$, $Na_5P_3O_3$, $Na_3P_3O_9$, $Na_2O_4P(NaO_3P)PO_3Na_2$, Calgon (sodium polymetaphosphate); aminopolycarboxylic acids and their salts, such as ethylenediamine-tetraacetic acid and its potassium and sodium salts, diethylenetriamine-pentaacetic acid and its potassium and sodium salts, triethylenetetramine-hexaacetic acid and its potassium and sodium salts, hydroxyethylethylenediamin-etriacetic acid and its potassium and sodium salts, nitrilotriacetic acid and its potassium and sodium salts, 1,2-diaminocyclohexane-tetraacetic acid and its potassium and sodium salts, and 1,3-diamino-2-propanol-tetraacetic acid and its potassium and sodium salts; and organic phosphonic acids and their salts, such as 2-phosphonobutane-tricarboxylic acid-1,2,4 and its potassium and sodium salts, 2-phosphonobutane-tricarboxylic acid-2,3,4 and its potassium and sodium salts, 1-phosphonoethane-tricarboxylic acid-1,2,2 and its potassium and sodium salts, 1-hydroxyethane-1,1-diphosphonic acid and its potassium and sodium salts, aminotri(methylenephosphonic acid) and its potassium and sodium salts. The optimum amount of the water softener in the developer varies depending on the hardness of the hard water used and on the amount thereof used in the developer. In general, the amount of the water softener in the developer during actual use should be between 0.01 and 5% by weight, preferably between 0.01 and 0.5% by weight.

In the case where the planographic printing plate precursor of the invention is processed by an automatic processor, the developer will be exhausted according to the amount of the plate precursors processed. In such a case, a replenisher or a fresh developer may be used to reactive processing. For this, the method described in U.S. Pat. No. 4,882,246 is preferably employed.

Developers containing a surfactant, an organic solvent, and a reducing agent such as those mentioned above are known in the art. For example, JP-A No. 51-77401 discloses a developer comprising benzyl alcohol, an anionic surfactant, an alkali agent and water; JP-A No. 53-44202 discloses an aqueous developer containing benzyl alcohol, an anionic surfactant and a water-soluble sulfite; and JP-A No. 55-155355 discloses a developer containing an organic solvent in which the solubility in water at room temperature is 10% by weight maximum, an alkali agent and water. These are all suitable for the present invention.

After having been processed with a developer and a replenisher such as those mentioned above, the printing plate is post-processed with a washing by water, a rinsing solution that contains a surfactant, or a fat-desensitizing solution that contains gum arabic or a starch derivative. Any of these solutions may be combined in any desired manner.

In the recent art of plate-making and printing, automatic processors for printing plates are widely used for rationalizing and standardizing the plate-making operation. In general, the automatic processor is composed of a developing and post-processing aspects, and comprises an apparatus for conveying printing plate precursors, processing solution tanks and spraying devices. Each exposed plate is developed by being conveyed horizontally, and sprayed in succession with processing solutions that are pumped up into and out of spray nozzles. Recently a different method has also become known in which each exposed plate precursor is successively conveyed and immersed into tanks filled with processing solutions by guide rolls. In such automatic processors, replenishing of respective processing solutions is carried out in accordance with the processing speed and the processing time. Replenishment may be automated by monitoring the electroconductivity of each processing solution with a sensor.

A processing system without replenishment is also employable using disposable processing solutions. In this system, printing plate precursors are processed with substantially unused processing solutions.

The planographic printing plates produced in the manner above may be coated with a fat-desensitizing gum before going through the printing process. Another option for enhancing their printing durability is burning.

Prior to burning, it is desirable that the planographic printing plates are treated with a surface-dressing solution, as, for example, in JP-B Nos. 61-2518, 55-28062, and JP-A Nos. 62-31859, 61-159655.

For this, the planographic printing plates may be wiped with a sponge or absorbent cotton soaked in a surface-dressing solution. They may also be dipped in a surface-dressing solution put in a vat, or a surface-dressing solution may be applied thereto with an automatic coater. After having been thus coated with a surface-dressing solution, better results are produced if the plates are squeezed with a squeegee or a squeezing roller to make the coating uniform.

The amount of the surface-dressing solution applied to the plates is generally between 0.03 and 0.8 $g/m^2$ (dry weight).

The planographic printing plates thus having been coated with the surface-dressing agent are, after the option of drying, heated at a high temperature in a burning processor (for example, Fuji Photo Film's Burning Processor Model BP-1300 (trade name)) The heating temperature and the heating time vary depending on the image-forming component in the plates. In general, however, it is desirable that the plates are heated at a temperature between 180 and 300° C., for 1 to 20 minutes.

After burning, it is optional to wash the planographic printing plates with water and gum them in any conventional manner. When they are treated with a surface-dressing solution containing a water-soluble polymer compound before burning, gumming them,—the treatment of fat-desensitization the treatment—may be omitted.

The planographic printing plate thus produced through the above process is then set into an offset printer to produce a large number of prints.

EXAMPLES

The invention is hereinafter described in detail with reference to examples. The examples, however, are not intended to restrict the scope of the invention.

Example 1

Preparation of Support with Hydrophilic Surface:

Formation of an Intermediate Layer:

Using a rod bar #17, a photopolymerizing composition stated below was applied onto a PET film (by Toyobo, trade name: M4100) having a thickness of 0.188 mm, and dried at 80° C. for 2 minutes. Next, the coated film surface was precured by exposing it to a 400 W high-pressure mercury lamp (by Riko Kagaku Sangyo, trade name: UVL-400P) for 10 minutes.

The photopolymerizing composition is as follows:

| | |
|---|---|
| Allyl methacrylate/methacrylic acid copolymer (80/20 by mol, molecular weight 100,000) | 4 g |
| Ethyleneoxide-modified bisphenol A diacrylate (by Toa Gosei, trade name: M210) | 4 g |
| 1-Hydroxycyclohexyl phenyl ketone | 1.6 g |
| 1-Methoxy-2-propanol | 16 g |

Formation of Hydrophilic Surface:

The intermediate layer-coated film was dipped in an aqueous monomer solution containing 10% by weight of sodium styrenesulfonate and 0.01% by weight of sodium hypochlorite, and exposed to a 400 W high-pressure mercury lamp in an argon atmosphere for 30 minutes. After being thus exposed, the film was throughly washed with ion-exchanged water to obtain a hydrophilic surface grafted with sodium styrene sulfonate. The result was the formation of the hydrophilic surface-containing PET film support of Example 1.

Formation of an Undercoat Layer:

Using a wire bar, an undercoating solution stated below was applied onto the PET film support, and dried in a hot air drier at 90° C. for 30 seconds. The dry weight of the undercoat layer thus formed was 10 mg/m$^2$.

Undercoating Solution:

The following compounds were mixed to prepare the undercoating solution used herein.

| | |
|---|---|
| Copolymer of ethyl methacrylate and sodium 2-acrylamido-2-methyl-1-propanesulfonate (75/15 by mol) | 0.1 g |
| 2-Aminoethylphosphonic acid | 0.1 g |
| Methanol | 50 g |
| Ion-exchanged water | 50 g |

Formation of Negative Recording Layer:

Using a wire bar, a coating solution for a recording layer as stated below was applied onto the undercoated support, and dried in a hot air drier at 115° C. for 45 seconds to form a negative recording layer thereon. The dry weight of the recording layer formed was 1.2 to 1.3 g/m$^2$.

The composition of the coating solution for the recording layer was as follows:

| | |
|---|---|
| IR absorbent (IR-6) | 0.08 g |
| Onium salt (SB-1) | 0.30 g |
| Dipentaerythritol hexaacrylate | 1.00 g |
| Copolymer of allyl methacrylate and methacrylic acid (80/20 by mol, weight-average molecular weight 120,000) | 1.00 g |
| Victoria Pure Blue naphthalenesulfonate | 0.04 g |
| Silicon-containing surfactant (trade name: TEGO GLIDE100, manufactured by Tego Chemie Service GmbH) | 0.03 g |
| Methyl ethyl ketone | 9.0 g |
| Methanol | 10.0 g |
| 1-Methoxy-2-propanol | 8.0 g |

The structures of the IR absorbent (IR-6) and the onium salt (SB-1) used in the coating solution for recording layer are illustrated below.

(IR-6)

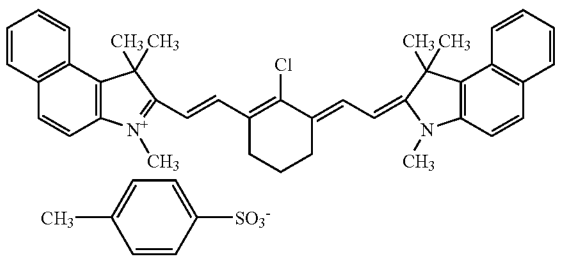

(SB-1)

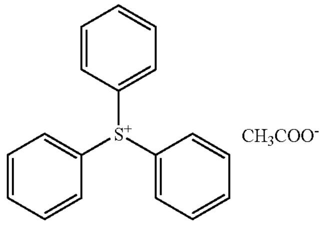

Formation of an Overcoat Layer:

20 g of polyvinyl alcohol (degree of saponification 98.5 mol %, degree of polymerization 500) was dissolved in 480 g of distilled water to prepare an overcoating solution. Using a wire bar, the overcoating solution was applied onto the recording layer-coated support, and dried in a hot air drier at 100° C. for 3 minutes to form an overcoat layer thereon to obtain a negative planographic printing plate precursor 1. The dry weight of the overcoat layer formed was 2.2 g/m$^2$.

Evaluation of the Planographic Printing Plate Precursor:

The negative planographic printing plate precursor 1 of the invention formed herein was exposed and developed according to the process stated below, and printing was attempted. The prints obtained were checked for stains.

Using Creo's Trendsetter 3244VFS (trade name) with a water-cooling 40 W IR semiconductor laser mounted thereon, the negative planographic printing plate precursor 1 was imagewise exposed to form an image area in the exposed surface of the precursor. The output was 9 W; the outer drum revolution was 210 rpm; the energy on the precursor surface was 100 mJ/cm$^2$; and the resolution was 2400 dpi. Using an automatic processor Stablon 900N (trade name, manufactured by Fuji Photo Film), the exposed precursor 1 was developed. An aqueous alkaline developer (trade name: DN-3C, manufactured by Fuji Photo Film) diluted with water at a ratio of 1/1 was used for both the developer in the bath and the replenisher. The temperature of the developer bath was 30° C. The finisher used was Fuji Photo Film's FN-6 (trade name) diluted with water at a ratio of 1/1.

Thus processed, the printing plate 1 was set in a printer (trade name: Lithrone, manufactured by Komori Corporation) for printing. The dampener used was an aqueous solution containing 1% of Fuji Photo Film's EU-3 (trade name) and 10% of isopropanol. The ink used was GEOSN BLACK (trade name, manufactured by DIS).

The printing plate 1 of the invention gave high-quality prints with no background stains. With the printing plate 1 still set therein, the printer was further made to produce 10,000 prints, and these prints were all good with no background stains. This confirms that the printing plate 1 maintained excellent hydrophilicity.

Example 2

An aluminum sheet processed according to the method mentioned below was prepared and used in place of the PET film for the support, and acrylic acid was used in place of sodium styrenesulfonate for forming the hydrophilic surface. A recording layer and an overcoat layer were also formed on the support in the same manner as in Example 1. The result was a negative planographic printing plate precursor 2 of Example 2.

Method of Processing the Aluminum Sheet:

An aluminum sheet (of an aluminium alloy of at least 99.5% aluminium, containing 0.30% Fe, 0.10% Si, 0.02% Ti and 0.013% Cu) having a thickness of 0.30 mm was degreased by washing it with trichloroethylene. Using a nylon brush, its surface was sand-grained with an aqueous suspension of 400-mesh pumice, and then throughly washed with water. The sheet was etched by dipping it in an aqueous 25 wt. % sodium hydroxide solution at 45° C. for 9 seconds, then washed with water, and further washed by dipping it in 2 wt. % nitric acid for 20 seconds. Due to this process, the sand-grained surface of the sheet was etched to a degree of about 3 $g/m^2$.

Next, the sheet was subjected to direct-current anodic oxidation in an electrolytic solution of 7 wt. % sulfuric acid at a current density of 15 $A/dm^2$ to form thereon an oxide film having a thickness of 2.4 $g/m^2$ that was then washed with water and dried.

Example 3

An aluminum sheet support having a hydrophilic surface grafted with acrylamide was prepared. The same aluminum sheet as in Example 2 was used in place of the PET film for the support, and acrylamide was used in place of sodium styrenesulfonate for forming the hydrophilic surface. A recording layer and an overcoat layer were also formed on the support in the same manner as in Example 1. The result was a negative planographic printing plate precursor 3 of Example 3.

Evaluation of Planographic Printing Plate Precursors:

The negative planographic printing plate precursors 2 and 3 of the invention were exposed and developed in the same manner as in Example 1, and the resulting printing plates were tried in the same printer as in Example 1. The prints obtained were checked for stains.

The printing plates from the precursors 2 and 3 also gave high-quality prints with no background stains. With each printing plate still set therein, the printer was made to produce 20,000 prints, and these prints were all good with no background stains. This confirms that the printing plates 2 and 3 maintained excellent hydrophilicity.

The results suggest that the negative printing plates from the precursors of the invention are free from the problem of background stains in prints, and provide high-quality prints.

What is claimed is:

1. A negative planographic printing plate precursor comprising a hydrophilic surface layer and a negative recording layer in this order on a support, wherein:

the hydrophilic surface layer comprises hydrophilic graft polymer chains;

the weight average molecular weight (Mw) of the hydrophilic graft polymer chains is from 500 to 5,000,000; and the negative recording layer comprises a radical generator, a radical-polymerizable compound, and a photothermal converting agent.

2. The negative planographic printing plate precursor according to claim 1, further comprising an intermediate layer between the support and the hydrophilic surface layer.

3. The negative planographic printing plate precursor according to claim 2, wherein the hydrophilic graft polymer chains are directly bonded to the intermediate layer.

4. The negative planographic printing plate precursor according to claim 3, wherein the hydrophilic graft polymer chains are chemically bonded to material of the intermediate layer.

5. The negative planographic printing plate precursor according to claim 3, wherein the hydrophilic graft polymer chains were formed by polymerizing a compound having a polymerizable double bond on the intermediate layer that serves as a base point for polymerization.

6. The negative planographic printing plate precursor according to claim 2, wherein the hydrophilic graft polymer chains were introduced into a crosslinked polymer film structure.

7. The negative planographic printing plate precursor according to claim 6, wherein the hydrophilic graft polymer introduction into the crosslinked polymer film structure is at least 0.1% of the overall surface area of the intermediate layer.

8. The negative planographic printing plate precursor according to claim 1, wherein the hydrophilic graft polymer chains are directly bonded to the support surface.

9. The negative planographic printing plate precursor according to claim 8, wherein the hydrophilic graft polymer chains are chemically bonded to material of the support.

10. The negative planographic printing plate precursor according to claim 8, wherein the hydrophilic graft polymer chains were formed by polymerizing a compound having a polymenzable double bond on the support that serves as a base point for polymerization.

11. The negative planographic printing plate precursor according to claim 1, wherein the hydrophilic graft polymer chains were introduced into a crosslinked polymer film structure.

12. The negative planographic printing plate precursor according to claim 11, wherein the hydrophilic graft polymer introduction into the crosslinked polymer film structure is at least 0.1% of the overall surface area of the support.

13. The negative planographic printing plate precursor according to claim 1, wherein the weight average molecular weight (Mw) of the hydrophilic graft polymer chains is from 1,000 to 1,000,000.

14. The negative planographic printing plate precursor according to claim 13, wherein the weight average molecular weight (Mw) of the hydrophilic graft polymer chains is from 2,000 to 500,000.

15. The negative planographic printing plate precursor according to claim 1, wherein the thickness of the hydrophilic surface layer is from 0.001 μm to 10 μm.

16. The negative planographic printing plate precursor according to claim 1, wherein the support is a polyester film or an aluminium sheet.

17. The negative planographic printing plate precursor according to claim 11, wherein the surface of the support was pre-roughened before being processed into a hydrophilic surface.

18. The negative planographic printing plate precursor according to claim 1, wherein the hydrophilic graft polymer chains were formed through copolymerization of a branch polymer with a stem polymer.

* * * * *